United States Patent
Shimizu

(10) Patent No.: US 9,600,123 B2
(45) Date of Patent: Mar. 21, 2017

(54) OPTICAL SENSOR AND ELECTRONIC APPARATUS

(71) Applicant: SHARP KABUSHIKI KAISHA, Osaka-shi, Osaka (JP)

(72) Inventor: Takayuki Shimizu, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 63 days.

(21) Appl. No.: 14/435,798

(22) PCT Filed: Oct. 8, 2013

(86) PCT No.: PCT/JP2013/077381
§ 371 (c)(1),
(2) Date: Apr. 15, 2015

(87) PCT Pub. No.: WO2014/061512
PCT Pub. Date: Apr. 24, 2014

(65) Prior Publication Data
US 2015/0261338 A1 Sep. 17, 2015

(30) Foreign Application Priority Data

Oct. 18, 2012 (JP) ................. 2012-231166

(51) Int. Cl.
*G06F 3/042* (2006.01)
*H03K 17/94* (2006.01)
(Continued)

(52) U.S. Cl.
CPC .............. *G06F 3/042* (2013.01); *G01S 7/481* (2013.01); *G01S 7/484* (2013.01); *G01S 7/4813* (2013.01);
(Continued)

(58) Field of Classification Search
CPC ........ G06F 3/042; G06F 3/017; G01S 7/4813; G01S 7/4861; G01S 17/58; G01S 7/4816;
(Continued)

(56) References Cited

U.S. PATENT DOCUMENTS

2016/0079447 A1* 3/2016 Kriebernegg ............ G01V 8/10
250/214 A

FOREIGN PATENT DOCUMENTS

JP 02293606 A * 12/1990
JP 09229620 A * 9/1997
(Continued)

*Primary Examiner* — Tarifur Chowdhury
*Assistant Examiner* — Mohamed K Amara
(74) *Attorney, Agent, or Firm* — Birch, Stewart, Kolasch & Birch, LLP

(57) ABSTRACT

An optical sensor includes: a driving circuit that turns off a light-emitting element during a first period, a second period, and a fourth period and that turns on the light-emitting element during a third period; an integrating circuit that outputs a first integrated-value difference (FID) and a second integrated-value difference (SID), the FID being a difference between an integrated value of a photocurrent generated by a light-receiving element in accordance with respective states of the light-emitting element during the first period and the second period, the SID being a difference between an integrated value of a photocurrent generated in accordance with respective state of the light-emitting element during the third period and the fourth period; and an output control circuit that outputs the SID when the FID is zero and that outputs a difference between the SID and the FID when the FID is not zero.

9 Claims, 21 Drawing Sheets

(51) Int. Cl.
*H01L 31/0232* (2014.01)
*H01L 31/173* (2006.01)
*G01S 7/481* (2006.01)
*G01S 17/50* (2006.01)
*G01S 17/02* (2006.01)
*G01S 17/46* (2006.01)
*G01S 17/58* (2006.01)
*G01S 7/484* (2006.01)
*G01S 7/486* (2006.01)
*G01S 7/487* (2006.01)
*G06F 3/01* (2006.01)

(52) U.S. Cl.
CPC ......... *G01S 7/4814* (2013.01); *G01S 7/4816* (2013.01); *G01S 7/4861* (2013.01); *G01S 7/4876* (2013.01); *G01S 17/026* (2013.01); *G01S 17/46* (2013.01); *G01S 17/50* (2013.01); *G01S 17/58* (2013.01); *G06F 3/017* (2013.01); *H01L 31/02327* (2013.01); *H01L 31/173* (2013.01); *H03K 17/941* (2013.01); *H03K 2217/94108* (2013.01); *H03K 2217/94112* (2013.01)

(58) Field of Classification Search
CPC .... G01S 17/026; G01S 7/4876; G01S 7/4814; G01S 17/46; G01S 7/484; G01S 7/481; G01S 17/50; H01L 31/02327; H01L 31/173; H03K 17/941; H03K 2217/94108; H03K 2217/94112; H01H 35/00; G10K 9/18
See application file for complete search history.

(56) References Cited

FOREIGN PATENT DOCUMENTS

| | | | |
|---|---|---|---|
| JP | 09269259 A | * | 10/1997 |
| JP | 2000-75046 A | | 3/2000 |
| JP | 2000164087 A | * | 6/2000 |
| JP | 2007248343 A | * | 9/2007 |
| JP | 2008-8849 A | | 1/2008 |
| JP | 2013096941 A | * | 5/2013 |
| WO | WO 2014/041858 A1 | | 3/2014 |

* cited by examiner

--PRIOR ART--

301: Light-emitting element
302, 303: Light-receiving element
304: Object to be sensed

OPTICAL SENSOR AND ELECTRONIC APPARATUS

TECHNICAL FIELD

The present invention relates to an optical sensor that is suitably used as a proximity sensor or a gesture sensor and to an electronic device using such an optical sensor.

BACKGROUND ART

Optical sensors have the functions of detecting objects to be sensed and detecting, for example, distances from objects to be sensed, and expand in application.

Electronic devices such as mobile phones (including smartphones) and digital cameras include liquid crystal panels for displaying images. Further, some of these electronic devices are types of electronic devices including touch panels to allow touch operations on liquid crystal panels. In such an electronic device including a liquid crystal panel and a touch panel, it is necessary to activate the touch panel in performing a normal touch operation, whereas it is not necessary to activate the touch panel when a face comes close.

Therefore, there is a growing demand for the mounting of the electronic device described above with a proximity sensor that, in order to reduce power consumption and prevent a malfunction of the touch panel, allows the touch panel to be deactivated when a face comes close to the liquid crystal panel. In response to such a demand, a mobile phone is for example configured such that an audio output section of the mobile phone that is put to an ear is mounted with a proximity sensor that senses the approach of a human's face to the mobile phone so that the touch panel is deactivated for the duration of a call.

Further, since an output value of the proximity sensor is inversely proportional to a distance of approach, there is a demand for the use of the proximity sensor as a range sensor.

For example, Patent Literature 1 describes using, as an optical sensor that senses the position of an object, a plurality of light-receiving elements to receive light from a light source, detect the orientation of the light source with respect to the light-receiving elements and the distance from the light-receiving elements to the light source, and thereby senses the position of the light source.

Furthermore, there is a demand for the disposition of a plurality of photodiodes in a light-receiving section of an optical sensor to sense a movement of an object from amounts of change in output values of the photodiodes.

For example, Patent Literature 2 discloses a reflective optical sensor as an optical sensor that senses a movement of an object. This optical sensor, as shown in FIG. 8, includes a light-emitting element 301 and two light-receiving elements 302 and 303, with the light-receiving elements 302 and 303 disposed on both sides of the light-emitting element 301 respectively. In a case where an object to be sensed 304 is on the right side, light reflected from the object to be sensed 304 strongly strikes the light-receiving element 303. On the other hand, in a case where the object to be sensed 304 is on the left side, light reflected from the object to be sensed 304 strongly strikes the light-receiving element 302. Moreover, the position and/or movement of the object to be sensed 304 can be detected by reading a difference between a photocurrent generated in the light-receiving element 302 and a photocurrent generated in the light-receiving element 303.

As a sensor that senses a movement of an object, there is also a demand for the use of an optical sensor as a gesture sensor that senses a movement of a hand. Such a gesture sensor is used as an added function of a proximity sensor, and senses a movement of a hand over the touch panel in a noncontact manner. This makes it possible to operate, in a scrolling manner, a screen displayed on the liquid crystal panel, without contaminating the surface of the liquid crystal panel even with a wet hand or a dirty hand.

CITATION LIST

Patent Literature 1
Japanese Patent Application Publication, Tokukai, No. 2008-8849 A (Publication Date: Jan. 17, 2008)
Patent Literature 2
Japanese Patent Application Publication, Tokukai, No. 2000-75046 A (Publication Date: Mar. 14, 2000)

SUMMARY OF INVENTION

Technical Problem

Such an electronic device mounted with a proximity sensor is often used outdoors or indoors. For this reason, even in a case where a disturbance light component attributed to natural light or illuminating light is incident on the proximity sensor, the electronic device is required to properly activate the proximity sensor. Therefore, the proximity sensor needs to be designed not to malfunction in response to outside light. Such a proximity sensor that is used in an environment where it is irradiated with intense disturbance light such as natural light or illuminating light is required to be higher in resistance to disturbance light than a general proximity sensor.

However, neither of Patent Literature 1 nor 2 takes any specific measures to prevent the respective optical sensor from malfunctioning in response to disturbance light.

The present invention has been made in view of the problems described above, and it is an object of the present invention to provide an optical sensor that can sense a movement of an object without malfunctioning in response to disturbance light.

Solution to Problem

In a first aspect of the present invention, an optical sensor includes: a light-emitting element; a light-receiving element that generates a photocurrent upon receiving reflected light from an object to be sensed reflecting light emitted by the light-emitting element; a driving circuit that causes the light-emitting element to be on or off during a first period, a second period, and a fourth period and that causes the light-emitting element to be off or on during a third period, the first period, the second period, the third period, and the fourth period following one after the other; an integrating circuit that outputs a first integrated-value difference and a second integrated-value difference, the first integrated-value difference being a difference between an integrated value of the photocurrent generated in accordance with a state of the light-emitting element during the first period and an integrated value of the photocurrent generated in accordance with a state of the light-emitting element during the second period, the second integrated-value difference being a difference between an integrated value of the photocurrent generated in accordance with a state of the light-emitting element during the third period and an integrated value of the photocurrent generated in accordance with a state of the light-emitting element during the fourth period; and an output control circuit that outputs the second integrated-value difference when the first integrated-value difference is zero and that outputs a difference between the second integrated-value difference and the first integrated-value difference when the first integrated-value difference is not zero.

In a second aspect of the present invention, an optical sensor includes: a light-emitting element; a light-receiving element that generates a photocurrent upon receiving reflected light from an object to be sensed reflecting light emitted by the light-emitting element; a driving circuit that causes the light-emitting element to be on or off during a first period and that causes the light-emitting element to be off or on during a second period, a third period, and a fourth period, the first period, the second period, the third period, and the fourth period following one after the other; an integrating circuit that outputs a first integrated-value difference and a second integrated-value difference, the first integrated-value difference being a difference between an integrated value of the photocurrent generated in accordance with a state of the light-emitting element during the first period and an integrated value of the photocurrent generated in accordance with a state of the light-emitting element during the second period, the second integrated-value difference being a difference between an integrated value of the photocurrent generated in accordance with a state of the light-emitting element during the third period and an integrated value of the photocurrent generated in accordance with a state of the light-emitting element during the fourth period; and an output control circuit that outputs the first integrated-value difference when the second integrated-value difference is zero and that outputs a difference between the first integrated-value difference and the second integrated-value difference when the second integrated-value difference is not zero.

Advantageous Effects of Invention

In one aspect of the present invention, the intensity of disturbance light is detected by a first integrated-value difference, and the output of a sensing signal is controlled according to the difference. Further, in another aspect of the present invention, the intensity of disturbance light is detected by a second integrated-value difference, and the output of a sensing signal is controlled according to the difference. This brings about an effect of making it possible to sense a movement of an object without malfunctioning due to disturbance light.

DESCRIPTION OF EMBODIMENTS

Embodiment 1

Embodiment 1 of the present invention is described below with reference to FIGS. 1 through 9.

(Configuration of an Optical Sensor)

Figure 1:
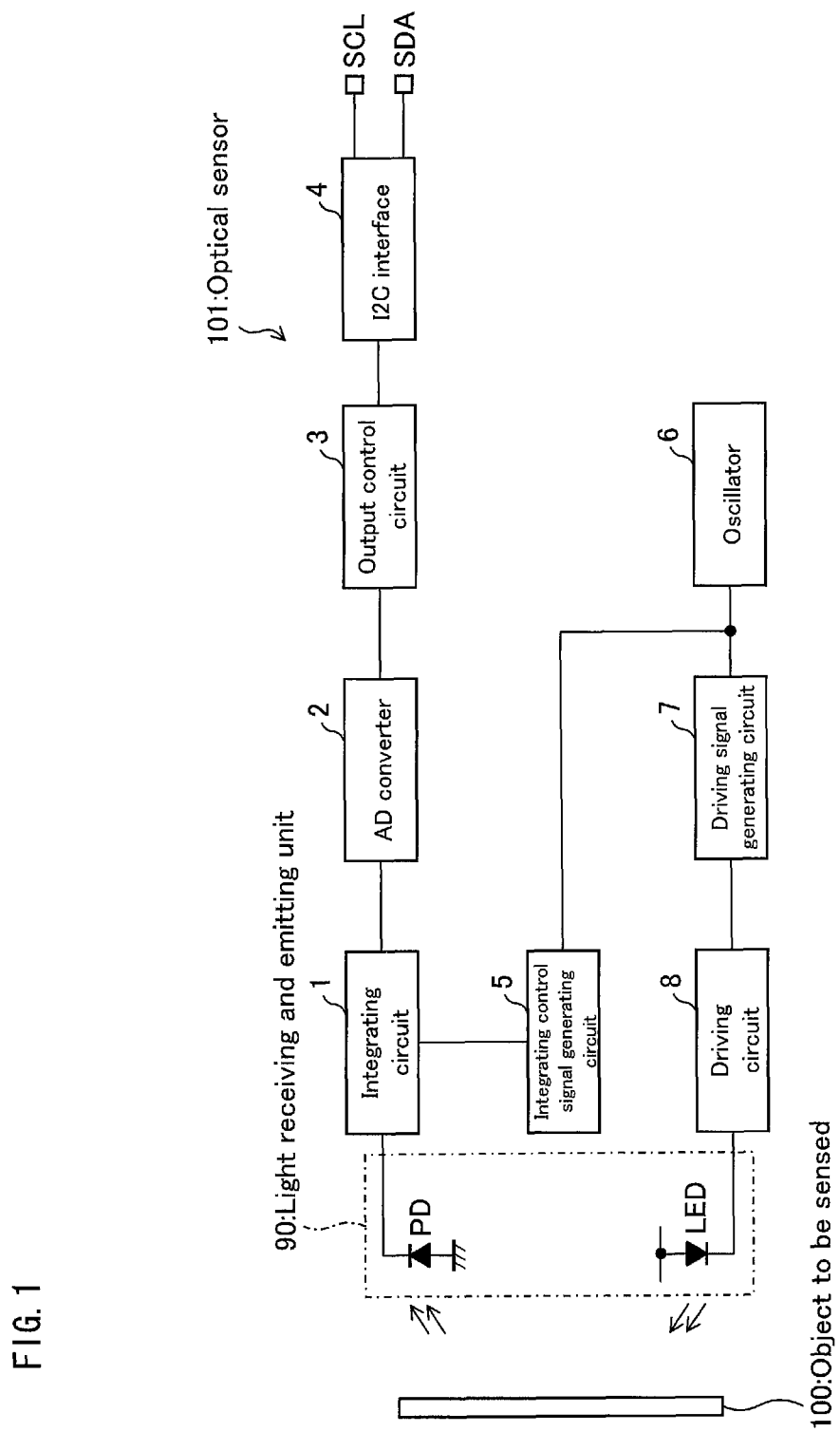
FIG. 1 is a block diagram showing a configuration of an optical sensor according to Embodiment 1 of the present invention.

FIG. 1 is a block diagram showing a configuration of an optical sensor 101 according to the present embodiment.

As shown in FIG. 1, the optical sensor 101 includes an integrating circuit 1, an AD converter 2, an output control circuit 3, an I2C interface 4, an integrating control signal generating circuit 5, an oscillator 6, a driving signal generating circuit 7, a driving circuit 8, and a light receiving and emitting unit 90. The optical sensor 101 irradiates an object to be sensed 100 with light that is emitted by a light-emitting element LED, receives reflected light from the object to be sensed 100 with a light-receiving element PD, performs a predetermined process on a current produced by photoelectric conversion in the light-receiving element PD, and outputs a sensing signal to sense the approach of the object to be sensed 100. Further, the light-emitting element LED and the light-receiving element PD in the optical sensor 101 are incorporated in the light receiving and emitting unit 90, which is described below.

<Configuration of the Light Receiving and Emitting Unit>

Figure 2:
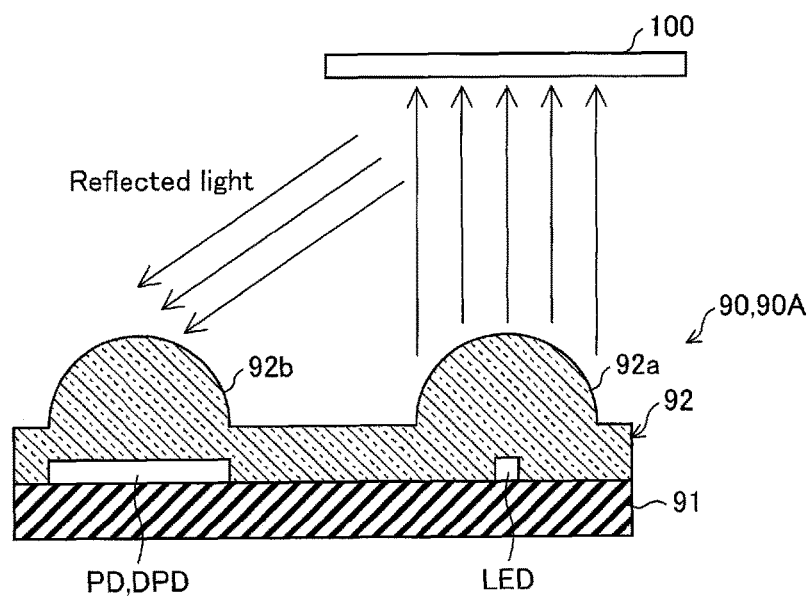
FIG. 2 is a longitudinal sectional view showing a mounting structure of a light-emitting element and a light-receiving element of a light receiving and emitting unit in the optical sensor of FIG. 1 and in an optical sensor of Embodiment 4.

FIG. 2 is a longitudinal sectional view showing a mounting structure of the light-emitting element LED and the light-receiving element PD of the light receiving and emitting unit 90 in the optical sensor 101.

As shown in FIG. 2, the light receiving and emitting unit 90 is constituted by the light-emitting element LED, the light-receiving element PD, a substrate 91, and a sealing member 92.

The light-emitting element LED and the light-receiving element PD are mounted at a distance from each other on the substrate 91. The light-emitting element LED is constituted by a light-emitting diode. Further, the light-receiving element PD is constituted by a photodiode or a phototransistor or by an OPIC (Optical IC) (registered trademark), which is made by integrating the light-receiving element PD with a signal processing circuit or an LED driver circuit.

The sealing member 92 is formed on the substrate 91 in such a manner as to cover the light-emitting element LED and the light-receiving element PD. The sealing member 92 is made of a transparent resin material or a visible light-cutting resin material that transmits a wavelength component of light emitted by the light-emitting element LED and cuts a visible light component. The sealing member 92 has a light-emitting lens portion 92a and a light-receiving lens portion 92b on a surface thereof. The light-emitting lens portion 92a is a convex lens having a hemispherical shape curved toward a side toward which the light-emitting element LED emits light. The light-emitting lens portion 92a causes the light from the light-emitting element LED to be emitted in such a manner as to be focused onto a predetermined position or to be converted into parallel light. The light-receiving lens portion 92b is a convex lens having a hemispherical shape curved toward a side from which the light-receiving element PD receives the light. The light-receiving lens portion 92b causes the light reflected from the object to be sensed 100 to be focused onto the light-receiving element PD.

<Configuration and Operation of the Integrating Circuit>

Figure 3:
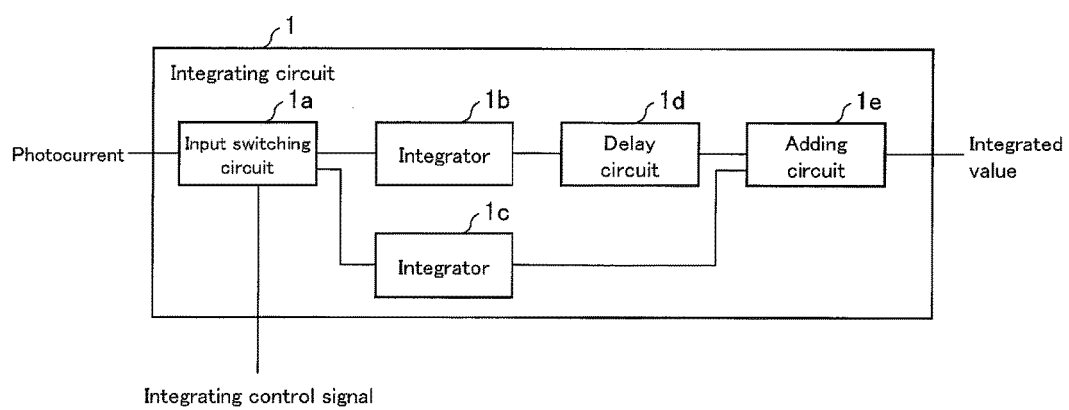
FIG. 3 is a block diagram showing a configuration of an integrating circuit in the optical sensor.
Figure 4:
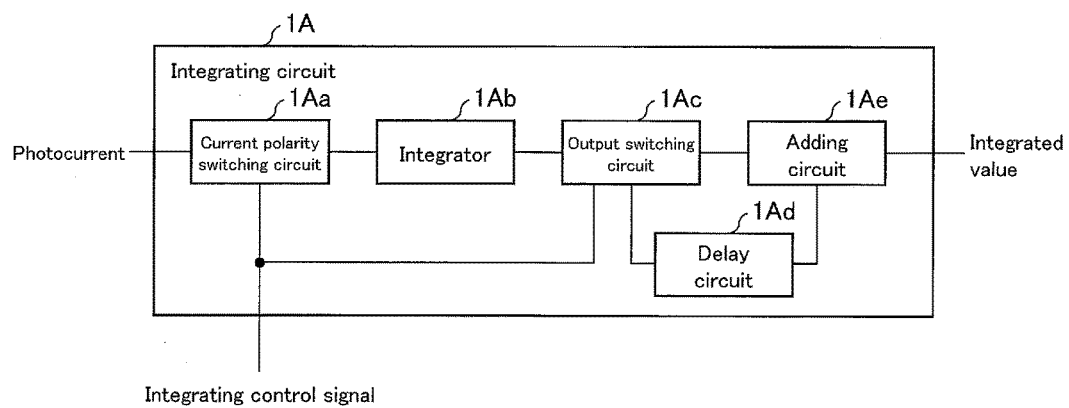
FIG. 4 is a block diagram showing a configuration of another integrating circuit in the optical sensor.

FIG. 3 is a block diagram showing a configuration of the integrating circuit 1 in the optical sensor 101. FIG. 4 is a block diagram showing a configuration of another integrating circuit 1A in the optical sensor 101.

As shown in FIG. 3, the integrating circuit 1 includes an input switching circuit 1a, integrators 1b and 1c, a delay circuit 1d, and an adding circuit 1e.

The integrator 1b is a circuit that integrates, in a positive direction, a photocurrent inputted thereto. The integrator 1c is a circuit that integrates, in a negative direction, a photocurrent inputted thereto.

The input switching circuit 1a is a circuit that alternately switches input paths in two consecutive integral periods so that the photocurrent from the light-receiving element PD is inputted to either the integrator 1b or 1c. The input switching circuit 1a is so controlled by an integrating control signal supplied from the integrating control signal generating circuit 5, which will be described later, as to switch between inputting the photocurrent to the integrator 1b and inputting the photocurrent to the integrator 1c.

The integrating control signal defines four integral periods INT1 to INT4 in which integration is executed, and also defines an integral cycle with the integral periods INT1 to INT4 as one cycle. The integral periods INT1 to INT4 are each a period during which the light-emitting element LED is on and off. The integral periods INT1 to INT4 are provided in a first period T1, a second period T2, a third period T3, and a fourth period T4, respectively. The first period T1, the second period T2, the third period T3, and the fourth period T4 will be described later.

The delay circuit 1d is a circuit that causes an integrated value outputted from the integrator 1b to be delayed by one integral period.

The adding circuit 1e is a circuit that adds together integrated values respectively outputted from the delay circuit 1d and the integrator 1c.

In the integrating circuit 1 thus configured, the integrator 1b integrates the photocurrent in a positive direction in a state in which the input switching circuit 1a has switched input paths so that the photocurrent is inputted to the integrator 1b. An integrated value outputted from the integrator 1b is delayed by one integral period by the delay circuit 1d. Meanwhile, the integrator 1c integrates the photocurrent in a negative direction in a state in which the input switching circuit 1a has switched input paths so that the photocurrent is inputted to the integrator 1c.

An integrated value outputted from the delay circuit 1d in the integral period INT1 and an integrated value output from the integrator 1c in the integral period INT2 are added together by the adding circuit 1e. Further, an integrated value outputted from the delay circuit 1d in the integral period INT3 and an integrated value output from the integrator 1c in the integral period INT4 are also added together by the adding circuit 1e. By thus adding together a positively integrated value and a negatively integrated value, an integrated value of a difference between the two integrated values is obtained.

Further, the integrating circuit 1 may be such an integrating circuit 1A as that shown in FIG. 4.

As shown in FIG. 4, the integrating circuit 1A includes a current polarity switching circuit 1Aa, an integrator 1Ab, an output switching circuit 1Ac, a delay circuit 1Ad, and an adding circuit 1Ae.

The current polarity switching circuit 1Aa is a circuit that alternately switches the polarities of a photocurrent from the light-receiving element PD in two consecutive integral periods. The current polarity switching circuit 1Aa is so controlled by the integrating control signal, described above, as to switch the polarities of the photocurrent.

The integrator 1Ab is a circuit that integrates a photocurrent outputted from the current polarity switching circuit 1Aa.

The output switching circuit 1Ac is a circuit that alternately switches output paths in two consecutive integral periods so that an integrated value outputted from the integrator is outputted to either the delay circuit 1Ad or the adding circuit 1Ae. The output switching circuit 1Ac is so controlled by the integrating control signal, described above, as to switch output paths.

The delay circuit 1Ad is a circuit that causes an integrated value outputted from the output switching circuit 1Ac to be delayed by one integral period.

The adding circuit 1Ae is a circuit that adds together the integrated values respectively outputted from the delay circuit 1Ad and the output switching circuit 1Ac.

In the integrating circuit 1A thus configured, a photocurrent outputted as a positive photocurrent from the current polarity switching circuit 1Aa is integrated by the integrator 1Ab. An integrated value outputted from the integrator 1Ab is outputted to the delay circuit 1Ab via the output switching circuit 1Ac, is delayed by one integral period by the delay circuit 1Ad, and is outputted to the adding circuit 1Ae.

Meanwhile, a photocurrent outputted as a negative photocurrent from the current polarity switching circuit 1Aa is integrated by the integrator 1Ab. An integrated value outputted from the integrator 1Ab is outputted to the adding circuit 1Ae via the output switching circuit 1Ac.

An integrated value outputted from the delay circuit 1Ad in the integral period INT1 and an integrated value output from the output switching circuit 1Ac in the integral period INT2 are added together by the adding circuit 1Ae. Further, an integrated value outputted from the delay circuit 1Ad in the integral period INT3 and an integrated value output from the output switching circuit 1Ac in the integral period INT4 are also added together by the adding circuit 1Ae. By thus adding together an integrated value of a positive-polarity photocurrent and an integrated value of a negative-polarity photocurrent, an integrated value of a difference between the two integrated values is obtained.

The integrating circuit 1A can output an integrated value equivalent to that which is outputted by the integrating circuit 1 shown in FIG. 3. Further, unlike the integrating circuit 1, which has two integrators (namely the integrators 1b and 1c), the integrating circuit 1A has one integrator (namely the integrator 1Ab). This makes it possible to achieve a simple circuit configuration.

In the case of a photocurrent containing a large DC (direct current) light component, there is a possibility of saturation of output from the integrators 1b and 1c in the integrating circuit 1 or from the integrator 1Ab in the integrating circuit 1A. For this reason, a difference between the integrated value in the integral period INT1 and the integrated value in the integral period INT2 is calculated, and a difference between the integrated value in the integral period INT3 and the integrated value in the integral period INT4 is calculated. This makes it possible to prevent saturation of the integrators 1b and 1c or the integrator 1Ab.

<Configuration of the AD Converter>

The AD converter 2 is a circuit that converts, into a digital value, an integrated value outputted from the integrating circuit 1. The AD converter 2 converts, into a digital integrated value ADC-1, a difference (first integrated-value difference) between the integrated values outputted from the integrating circuit 1 (integrating circuit 1A) in the integral periods INT1 and INT2 respectively, and outputs the digital integrated value ADC-1. Further, AD converter 2 converts, into a digital integrated value ADC-2, a difference (second integrated-value difference) between the integrated values outputted from the integrating circuit 1 (integrating circuit 1A) in the integral periods INT3 and INT4 respectively, and outputs the digital integrated value ADC-2.

<Configuration of the Output Control Circuit>

Figure 5:
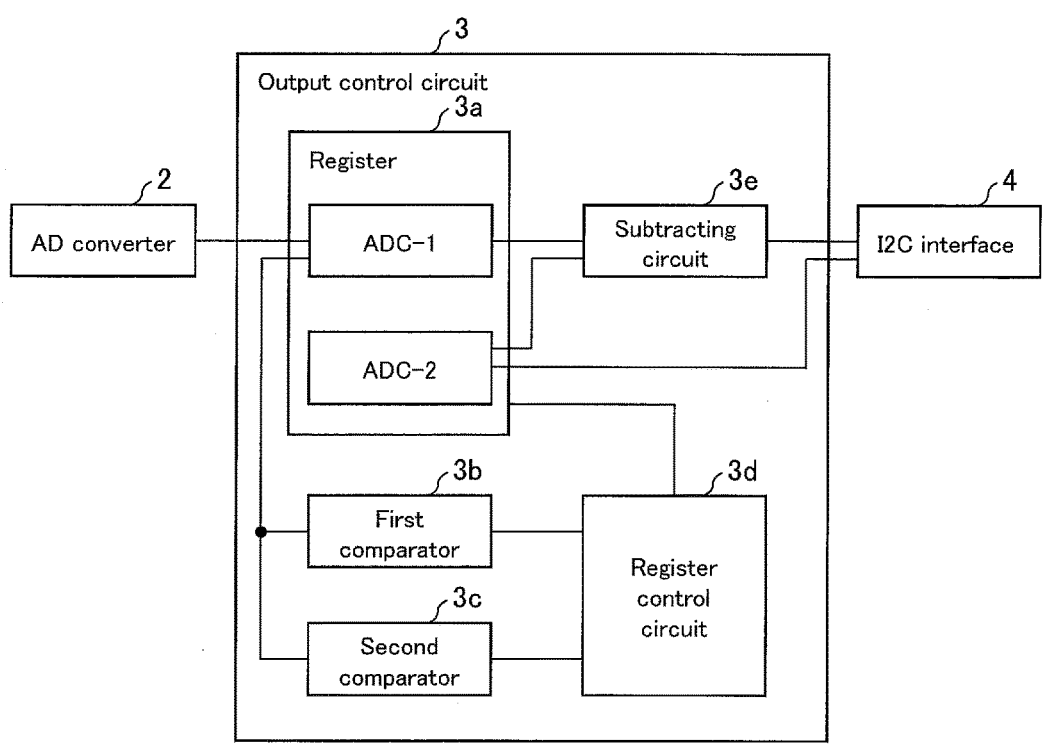
FIG. 5 is a block diagram showing a configuration of an output control circuit in the optical sensor.

FIG. 5 is a block diagram showing a configuration of the output control circuit 3 in the optical sensor 101.

The output control circuit 3 is a circuit that controls output in accordance with the digital integrated value ADC-1 outputted from the AD converter 2 as to whether the digital integrated value ADC-2 is directly outputted or a difference between the digital integrated value ADC-1 and the digital integrated value ADC-2 is outputted. Alternatively, the output control circuit 3 is a circuit that controls output in accordance with the digital integrated value ADC-2 outputted from the AD converter 2 as to whether the digital integrated value ADC-1 is directly outputted or the difference between the digital integrated value ADC-1 and the digital integrated value ADC-2 is outputted. The output control circuit 3 includes a register 3a, a first comparator 3b, a second comparator 3c, a register control circuit 3d, and a subtracting circuit 3e.

The register 3a is a storage section in which the digital integrated values ADC-1 and ADC-2 outputted from the AD converter 2 are separately stored.

The first comparator 3b determines whether or not the absolute value of the digital integrated value ADC-1 or ADC-2 stored in the register 3a is smaller than a set value (threshold value) set in advance.

The second comparator 3c determines whether or not the digital integrated value ADC-1 and ADC-2 stored in the register 3a is zero or a positive or negative value.

The register control circuit 3d controls writing of the register 3a so that the digital integrated value ADC-1 outputted from the AD converter 2 is stored in the register 3a.

Further, in the case of a first driving pattern in which the light-emitting element LED is off during the first period T1, off during the second period T2, on during the third period T3, and off during the fourth period T4, the register control circuit 3d controls reading and writing of the register 3a in a manner described below. In the case of a second driving pattern in which the light-emitting element LED is on during the first period T1 and off during the second period T2 to the fourth period T3, the register control circuit 3d controls reading and writing of the register 3a in a manner described below.

In the case of the first driving pattern, when the first comparator 3b determines that the absolute value of the digital integrated value ADC-1 is smaller than the set value, the register control circuit 3d controls writing of the register 3a so that the digital integrated value ADC-2 from the AD converter 2 is stored in the register 3a. On the other hand, when the first comparator 3b determines that the absolute value of the digital integrated value ADC-1 is not smaller than the set value, the register control circuit 3d prohibits writing of the register 3a so that the digital integrated value ADC-2 from the AD converter 2 is not stored in the register 3a.

In the case of the second driving pattern, the register control circuit 3d controls writing of the register 3a so that the digital integrated values ADC-1 and ADC-2 inputted are written to the register 3a. Further, when the first comparator 3b determines that the absolute value of the digital integrated value ADC-2 is smaller than the set value, the register control circuit 3a controls the register 3a so that the digital integrated value ADC-1 can be read out from the register 3a. On the other hand, when the first comparator 3b determines that the absolute value of the digital integrated value ADC-2 is not smaller than the set value, the register control circuit 3a prohibits reading of the register 3a so that the digital integrated value ADC-1 is not read out from the register 3a.

Furthermore, in the first driving pattern, in a case where the digital integrated value ADC-2 is written in the register 3a, the register control circuit 3d controls reading of the register 3a as follows: When the second comparator 3c determines that the digital integrated ADC-1 is zero, the register control circuit 3d controls reading of the register 3a so that the digital integrated value ADC-2 is outputted from the register 3a to the I2C interface 4. On the other hand, when the second comparator 3c determines that the digital integrated ADC-1 is positive or negative, the register control circuit 3d controls reading of the register 3a so that the digital integrated values ADC-1 and ADC-2 are outputted from the register 3a to the subtracting circuit 3e.

In the second driving pattern, when the second comparator 3c determines that the digital integrated ADC-2 is zero, the register control circuit 3d controls reading of the register 3a so that the digital integrated value ADC-1 is outputted from the register 3a to the I2C interface 4 On the other hand, when the second comparator 3c determines that the digital integrated ADC-2 is positive or negative, the register control circuit 3d controls reading of the register 3a so that the digital integrated values ADC-1 and ADC-2 are outputted from the register 3a to the subtracting circuit 3e.

The register control circuit 3d controls writing of the digital integrated values ADC-1 and ADC-2 to the register 3a in synchronization with the integral periods INT2 and INT1. Therefore, the register control circuit 3d performs such writing control in accordance with an integrating control signal.

The subtracting circuit 3e is a circuit that subtracts the smaller one of the digital integrated values ADC-1 and ADC-2 outputted from the register 3a from the larger one of them. That is, in a case where the digital integrated value ADC-1 is larger than the digital integrated value ADC-2, the subtracting circuit 3e subtracts the digital integrated value ADC-2 from the digital integrated value ADC-1. Alternatively, in a case where the digital integrated value ADC-2 is larger than the digital integrated value ADC-1, the subtracting circuit 3e subtracts the digital integrated value ADC-1 from the digital integrated value ADC-2. The register control circuit 3d determines which of the digital integrated values ADC-1 and ADC-2 is larger, and supplies the subtracting circuit 3e with the larger value as a value from which the smaller value is subtracted and supplies the subtracting circuit 3e with the smaller value as a value that is subtracted from the larger value.

Alternatively, the subtracting circuit 3e may output the absolute value of a difference between the digital integrated values ADC-1 and ADC-2. This makes it unnecessary to determine which of the digital integrated values ADC-1 and ADC-2 is larger.

<Configuration of the I2C Interface>

The I2C interface 4 is a circuit that causes a digital value outputted from the register 3a to be outputted as serial data SDA in synchronization with a serial clock SCL sent from an outside source.

<Configuration of the Oscillator and the Integrating Control Signal Generating Circuit>

The oscillator 6 is a circuit that generates a reference clock of a predetermined cycle.

In accordance with the reference clock from the oscillator 6, the integrating control signal generating circuit 5 outputs an integrating control signal that is at a high level during each of the aforementioned integral periods INT1 to INT4 in which integration is performed and that is at a low level during a non-integral period in which integration is not performed. The integral periods INT1 to INT4 are set as periods that are shorter than the aforementioned first to fourth periods T1 to T4 during which the light-emitting element LED is on or on.

<Configuration of the Driving Signal Generating Circuit and the Driving Circuit>

The driving signal generating circuit 7 is a circuit that generates, in accordance with the reference clock sent from the oscillator 6, a driving signal by which the light-emitting element LED is driven. The driving signal is a signal that causes the light-emitting element LED to be turned on and off in a cycle in units of the first period T1, the second period T2, the third period T3, and the fourth period T4. The first to fourth periods T1 to T4 correspond to the on periods and the off periods.

In the following description, the light-emitting LED is driven (first driving pattern) so that the light-emitting element LED is off during the first period T1, the second period T2, and the fourth period T4 and on during the third period T3, or the light-emitting LED is driven (second driving pattern) so that the light-emitting element LED is on during the first period T1 and off during the second period T2 to the fourth period T4. However, driving patterns are not limited to such drive control. For example, opposite to the first driving pattern, the light-emitting LED may be driven so that the light-emitting element LED is on during the first period T1, the second period T2, and the fourth period T4 and off during the third period T3. Further, opposite to the second driving pattern, the light-emitting LED may be driven so that the light-emitting element LED is off during the first period T1 and on during the second period T2 to the fourth period T4.

The driving circuit 8 is a circuit that generates, in accordance with the driving signal generated by the driving signal generating circuit 7, a driving current by which the light-emitting element LED is driven. The driving current is a pulse current, and is supplied to the light-emitting element LED as an optical pulse signal.

(Operation of the Optical Sensor)

<Basic Operation>

When the driving signal generating circuit 7 generates a driving signal in accordance with the reference clock sent from the oscillator 6, the driving circuit 8 outputs an optical pulse signal. The light-emitting element LED emits light in a predetermined cycle in accordance with the optical pulse signal to output an infrared optical pulse.

When the object to be sensed 100 is not located on an optical path of light emitted from the light-emitting element LED, the light emitted from the light-emitting element LED keeps traveling. For this reason, the light-receiving element PD does not receive light reflected from the object to be sensed 100, and only surrounding light is incident on the light-receiving element PD. Therefore, the amount of light incident on the light-receiving element PD is small. In this case, the object to be sensed 100 is not detected.

When the object to be sensed 100 comes closer to the optical sensor 101 to reach a position on the optical path of the light emitted from the light-emitting element LED, the light emitted from the light-emitting element LED is reflected by the object to be sensed 100. The closer the object to be sensed 100 comes to the optical sensor 101, the larger the amount of light reflected from the object to be sensed 100 becomes.

When the object to be sensed 100 reaches a position where it completely blocks the optical path and reflects all of the light emitted from the light-emitting element LED, the object to be sensed 100 is closest to the optical sensor 101. In this state, the amount of reflected light is at a maximum. The light-receiving element PD receives reflected light from the object to be sensed 100, whereby the amount of incident light increases. The light-receiving element PD generates a photocurrent proportional to the amount of incident light.

In the optical sensor 101, a photocurrent generated by the light-receiving element PD is integrated by the integrating circuit 1. An integrated value from the integrating circuit 1 is converted into digital integrated values ADC-1 and ADC-2 by the AD converter 2. Then, a sensing signal to sense the approach of the object to be sensed 100 is outputted by the output control circuit 3 in accordance with the digital integrated values ADC-1 and ADC-2 outputted from the AD converter 2. Furthermore, serial data SDA based on the sensing signal is outputted from the I2C interface 4 in synchronization with a serial clock SCL sent from an outside source.

When used as a proximity sensor, the optical sensor 101 outputs a sensing signal in response to the approach of an object to detected 100. Meanwhile, when used as a gesture sensor, the optical sensor 101 senses a movement of an object to be sensed 100.

<Operation in the Absence of Disturbance Light>

Figure 6:
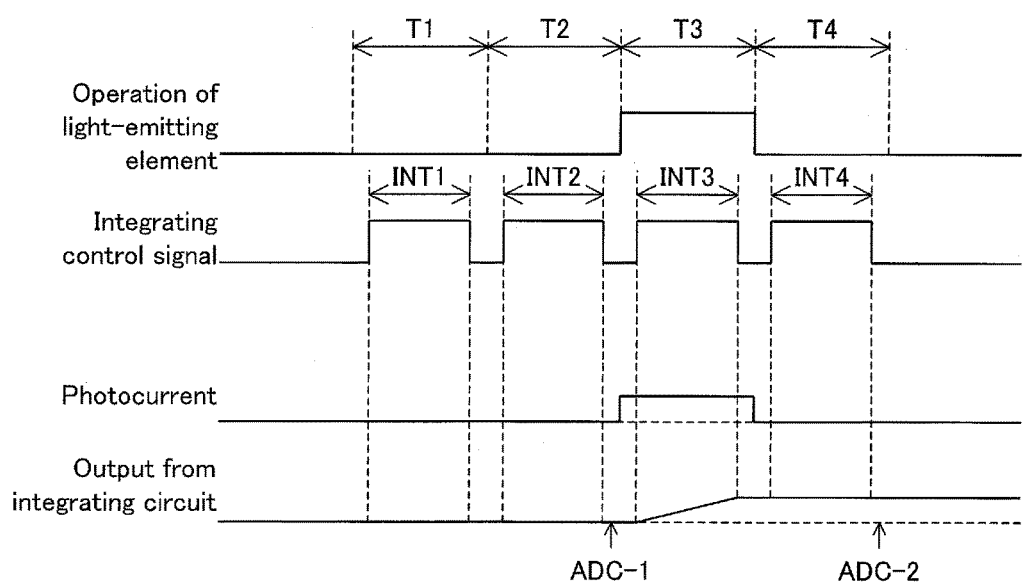
FIG. 6 is a timing chart showing a way in which the optical sensor operates in the absence of disturbance light.
Figure 19:
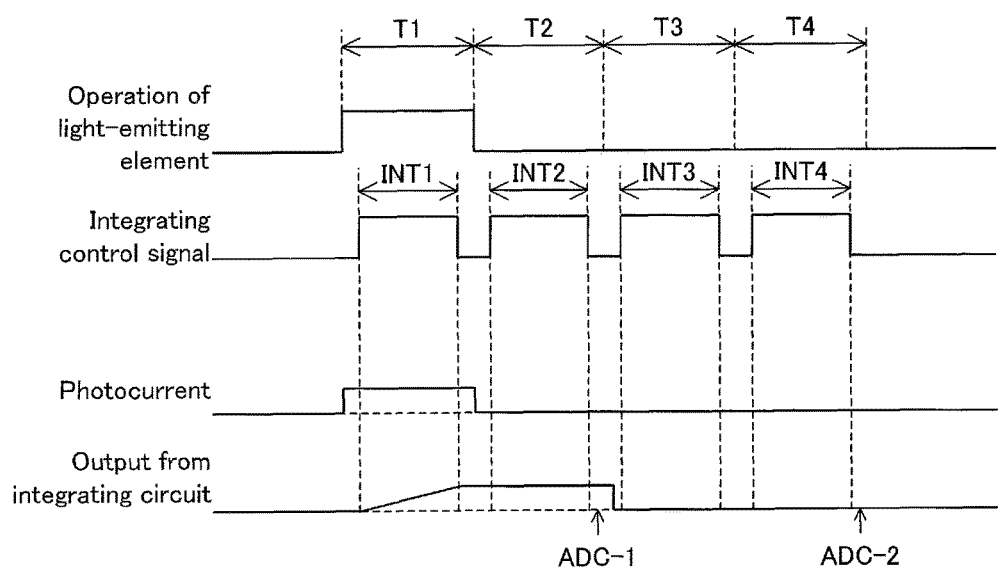
FIG. 19 is a timing chart showing another way in which the optical sensor according to Embodiment 1 operates in the absence of disturbance light.

FIG. 6 is a timing chart showing a way in which the optical sensor 101 operates in the absence of disturbance light. FIG. 19 is a timing chart showing another way in which the optical sensor 101 operates in the absence of disturbance light.

As shown in FIG. 6, the light-emitting element LED is driven in the first driving pattern in which the light-emitting element LED is off during the first period T1, off during the second period T2, on during the third period T3, and off during the fourth period T4. In this case, the first period T1 and the second period T2 constitute a disturbance light sensing period in which disturbance light is sensed, and the third period T3 and the fourth period T4 constitute an object-to-be-sensed sensing period in which an object to be sensed 100 is sensed.

First, in the first period T1 and the second period T2, during which the light-emitting element LED is off, the light-receiving element PD does not generate a photocurrent. In this state, a difference between integrated values integrated by the integrating circuit 1 in the integral periods INT1 and INT2 is zero (reference voltage). Therefore, in this case, the digital integrated value ADC-1 is zero. The digital integrated value ADC-1 is stored in the register 3a, and the integrating circuit 1 is reset.

In the third period T3 that follows, during which the light-emitting element LED is on, light reflected from the object to be sensed 100 is incident on the light-receiving element PD. In this case, where disturbance light is absent, the light-receiving element PD generates a pulsed photocurrent proportional in magnitude to the amount of reflected light (see FIG. 6). This causes an increase in integrated value in the integral period INT3.

In the fourth period T4 that follows, during which the light-emitting element LED is off, the light-receiving element PD does not generate a photocurrent. Since this causes the integrated value from the integrating circuit 1 to be maintained at a certain value, a digital integrated value ADC-2 of this integrated value is outputted from the AD converter 2.

In this case, the first comparator 3b determines that the absolute value of the digital integrated value ADC-1 is smaller than the predetermined value, and the digital integrated value ADC-2 is therefore stored in the register 3a. Further, since the second comparator 3c determines that the digital integrated value ADC-1 is zero, only the digital integrated value ADC-2 is read out from the register 3a and outputted to the I2C interface 4.

In accordance with the digital integrated value ADC-2 inputted to the I2C interface 4, the I2C interface 4 outputs serial data SDA as a sensing signal in synchronization with a serial clock SCL sent from an outside source. The sensing signal is supplied to a microcomputer or the like. In the case of proximity sensing processing, the sensing signal is utilized as proximity data.

In the example described above, disturbance light is absent. Therefore, the outputs from the integrators 1b and 1c in the integrating circuit 1 do not change from the initial values, and the digital integrated value ADC-1, which represents the disturbance light component, is zero. This makes it possible to, in the third period T3 during which the light-emitting LED is on, accurately detect light reflected from the object to be sensed 100. In this case, as described above, the digital integrated value ADC-2 is stored in the register 3a for use as a sensing signal.

In the example shown in FIG. 19, the light-emitting element LED is driven in the second driving pattern in which the light-emitting element LED is on during the first period T1 and off during the second period T2 to the fourth period T4. In the case of the second driving pattern, unlike in the aforementioned case shown in FIG. 6, the first period T1 and the second period T2 constitute an object-to-be-sensed sensing period, and the third period T3 and the fourth period T4 constitute a disturbance light sensing period.

First, in the first period T1, in which the light-emitting element LED is on, light reflected from the object to be sensed 100 is incident on the light-receiving element PD. In this case, where disturbance light is absent, the light-receiving element PD generates a pulsed photocurrent proportional in magnitude to the amount of reflected light (see FIG. 19). This causes an increase in integrated value in the integral period INT1.

In the second period T2 that follows, during which the light-emitting element LED is off, the light-receiving element PD does not generate a photocurrent. Since this causes the integrated value integrated in the integral period INT2 to be maintained at a certain value, a digital integrated value ADC-1 of this integrated value is outputted from the AD converter 2. The digital integrated value ADC-1 is stored in the register 3a, and the integrating circuit 1 is reset.

In the third period T3 and the fourth period T4 that follow, too, during which the light-emitting element LED is off, the light-receiving element PD does not generate a photocurrent. In this state, a difference between integrated values integrated by the integrating circuit 1 in the integral periods INT3 and INT4 is zero. Therefore, in this case, the digital integrated value ADC-2 is zero. Further, the register control circuit 3d determines that the digital integrated value ADC-1 is smaller than the predetermined value, and the digital integrated value ADC-2 is therefore stored in the register 3a.

In this case, the first comparator 3b determines that the absolute value of the digital integrated value ADC-2 is smaller than the predetermined value, and the digital integrated value ADC-1 therefore becomes able to be read out from the register 3a. Further, since the second comparator 3c determines that the digital integrated value ADC-2 is zero, only the digital integrated value ADC-1 is read out from the register 3a and outputted to the I2C interface 4.

In the example described above, too, disturbance light is absent. Therefore, the outputs from the integrators 1b and 1c in the integrating circuit 1 do not change from the initial values, and the digital integrated value ADC-2, which represents the disturbance light component, is zero. This makes it possible to, in the first period T1 during which the light-emitting LED is on, accurately detect light reflected from the object to be sensed 100. In this case, as described above, the digital integrated value ADC-1 is stored in the register 3a for use as a sensing signal.

It should be noted that in the example of operation in the first driving pattern, only the digital integrated value ADC-2 is read out from the register 3a in a case where the digital integrated value ADC-1 is zero. On the other hand, in the example of operation in the second driving pattern, only the digital integrated value ADC-1 is read out from the register 3a in a case where the digital integrated value ADC-2 is zero. However, read-out control of the digital integrated values ADC-1 and ADC-2 is not limited to this.

For example, in the first driving pattern and the second driving pattern, the register control circuit 3d performs read-out control in such a manner as to read out the digital integrated values ADC-1 and ADC-2 from the register 3a even if the digital integrated values ADC-1 and ADC-2 are zero. In this example of control, the digital integrated values ADC-1 and ADC-2 are subjected to a subtraction procedure by the subtracting circuit 3e. However, since either the digital integrated value ADC-1 or ADC-2 is zero, the subtraction procedure, even if performed as above, give the same result as that which is given by reading out the other of the digital integrated value ADC-1 and ADC-2 that is not zero. This example of control, although requiring the subtraction procedure to be performed by the subtracting circuit 3e, makes it unnecessary to determine whether or not the digital integrated values ADC-1 and ADC-2 are zero, thus making it possible to omit the second comparator 3c.

This example of control is also applicable to operation in the presence of DC disturbance light. Operation in the presence of DC disturbance light is described below (see examples shown in FIGS. 7 and 20).

<Operation in the Presence of DC Disturbance Light>

Figure 7:
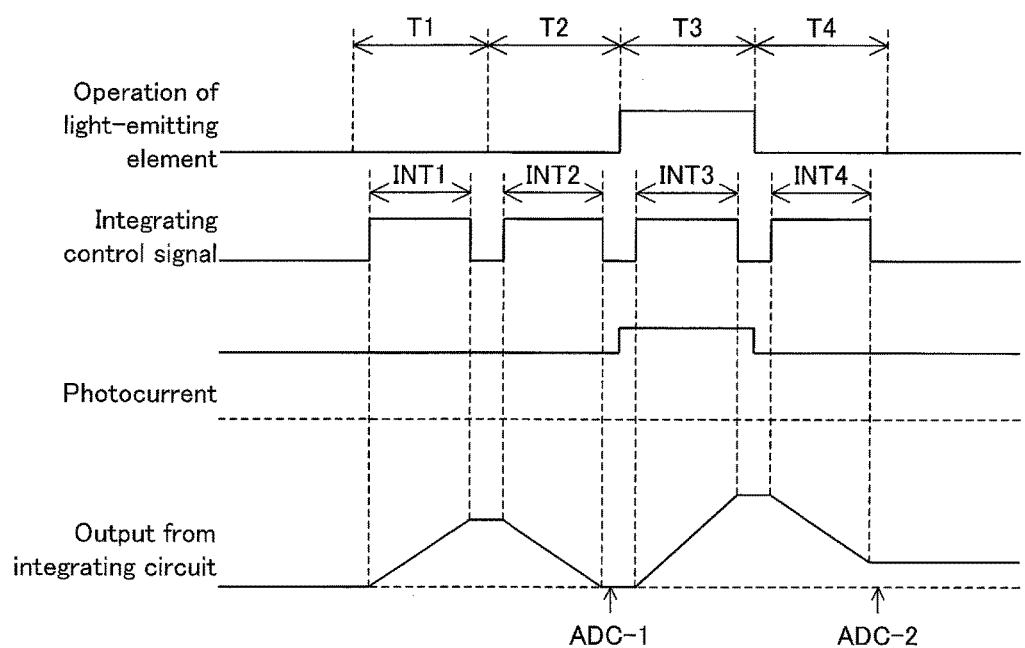
FIG. 7 is a timing chart showing a way in which the optical sensor operates in a case where constant disturbance light is incident.
Figure 20:
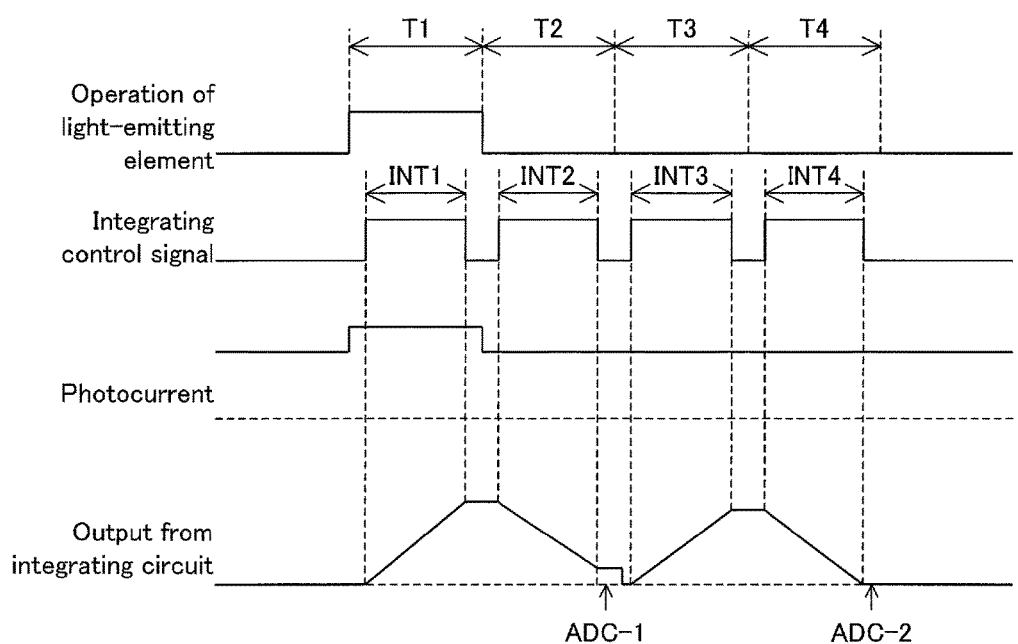
FIG. 20 is a timing chart showing another way in which the optical sensor according to Embodiment 1 operates in a case where constant disturbance light is incident.

FIG. 7 is a timing chart showing a way in which the optical sensor 101 operates in a case where constant disturbance light is incident. FIG. 20 is a timing chart showing another way in which the optical sensor 101 operates in a case where constant disturbance light is incident.

As shown in FIG. 7, in the first period T1 and the second period T2 in the first driving pattern, the light-emitting element LED is off, but a constant amount of disturbance light is present; therefore, the light-receiving element PD generates a photocurrent proportional to the amount of disturbance light. In this state, the photocurrent takes on the same value during the integral periods INT1 and INT2, the integrated values in the integral periods INT1 and INT2 by the integrating circuit 1 are equal. Therefore, in this case, the output from the integrating circuit 1 is zero, and the digital integrated value ADC-1 is zero, with the result that the disturbance light component is cancelled out. When the digital integrated value ADC-1 is stored in the register 3a, the integrating circuit 1 is reset.

In the third period T3 that follows, during which the light-emitting element LED is on, light reflected from the object to be sensed 100 and disturbance light are incident on the light-receiving element PD. At this point in time, as shown in FIG. 7, the light-receiving element PD generates a photocurrent in which a value proportional to the amount of reflected light has been superposed on the constant value (disturbance light component). This causes an increase in integrated value in the integral period INT3.

In the fourth period T4 that follows, during which the light-emitting element LED is off, the light-receiving element PD generates a photocurrent based on the disturbance light component as it does in the first and second periods T1 and T2. This causes the integrated value in the integral period INT4 to be equal to the integrated value in the integral period INT2. In this case, the integrated value outputted from the integrating circuit 1 has its disturbance light component canceled out to leave only a reflected light component, and is outputted as a digital integrated value ADC-2 from the AD converter 2.

In this case, the first comparator 3b determines that the absolute value of the digital integrated value ADC-1 is smaller than the predetermined value, and the digital integrated value ADC-2 is therefore stored in the register 3a. Further, since the second comparator 3c determines that the digital integrated value ADC-1 is zero, only the digital integrated value ADC-2 is read out from the register 3a and outputted to the I2C interface 4.

In accordance with the digital integrated value ADC-2 inputted to the I2C interface 4, the I2C interface 4 outputs serial data SDA as a sensing signal in synchronization with a serial clock SCL sent from an outside source. The sensing signal is supplied to a microcomputer or the like. In the case of proximity sensing processing, the sensing signal is utilized as proximity data.

In such a state in which constant disturbance light is present, the disturbance light component can be completely eliminated from the sensing signal.

In the example shown in FIG. 20, as in the example shown in FIG. 19, the light-emitting element LED is driven in the second driving pattern. In the example shown in FIG. 20, the light-emitting element LED is on, but a constant amount of disturbance light is present; therefore, light reflected from the object to be sensed 100 and disturbance light are incident on the light-receiving element PD. At this point in time, the light-receiving element PD generates a photocurrent in which a value proportional to the amount of reflected light has been superposed on the constant value (disturbance light component). This causes an increase in integrated value in the integral period INT1.

In the second period T2 that follows, the light-emitting element LED is off, but a constant amount of disturbance light is present; therefore, the light-receiving element PD generates a photocurrent based on the disturbance light. Since this causes the integrated value integrated in the integral period INT2 to be maintained at a certain value, a digital integrated value ADC-1 of this integrated value is outputted from the AD converter 2. When the digital integrated value ADC-1 is stored in the register 3a, the integrating circuit 1 is reset.

In the third period T3 and the fourth period T4 that follow, too, the light-emitting element LED is off, but a constant amount of disturbance light is present; therefore, the integrated values in the integral periods INT3 and INT4 by the integrating circuit 1 are equal. At this point in time, the output from the integrating circuit 1 is zero; therefore, the digital integrated value ADC-2 is zero, too.

In this case, the first comparator 3b determines that the absolute value of the digital integrated value ADC-1 is smaller than the predetermined value, and the digital integrated value ADC-1 therefore becomes able to be read out from the register 3a. Further, since the second comparator 3c determines that the digital integrated value ADC-2 is zero, only the digital integrated value ADC-1 is read out from the register 3a and outputted to the I2C interface 4.

In such a case where a constant amount of disturbance light is present, as in the case of the first driving pattern mentioned above, the disturbance light component can be completely eliminated from the sensing signal.

<Operation in the Presence of Changing Disturbance Light>

Usually, light from an illuminator varies in brightness at twice as high a frequency (100 Hz or 120 Hz) as a commercial frequency (50 Hz or 60 Hz). Further, an optical waveform of an inverter fluorescent light is such an optical waveform that a frequency of several tens of kilohertz has been superposed on the commercial frequency, the intensity of disturbance light often varies with time during a sensing operation of a proximity sensor.

In view of this, operation of the optical sensor 101 in a case where disturbance light temporally changes is described here.

(1) Case Where Disturbance Light Increases

Figure 8:
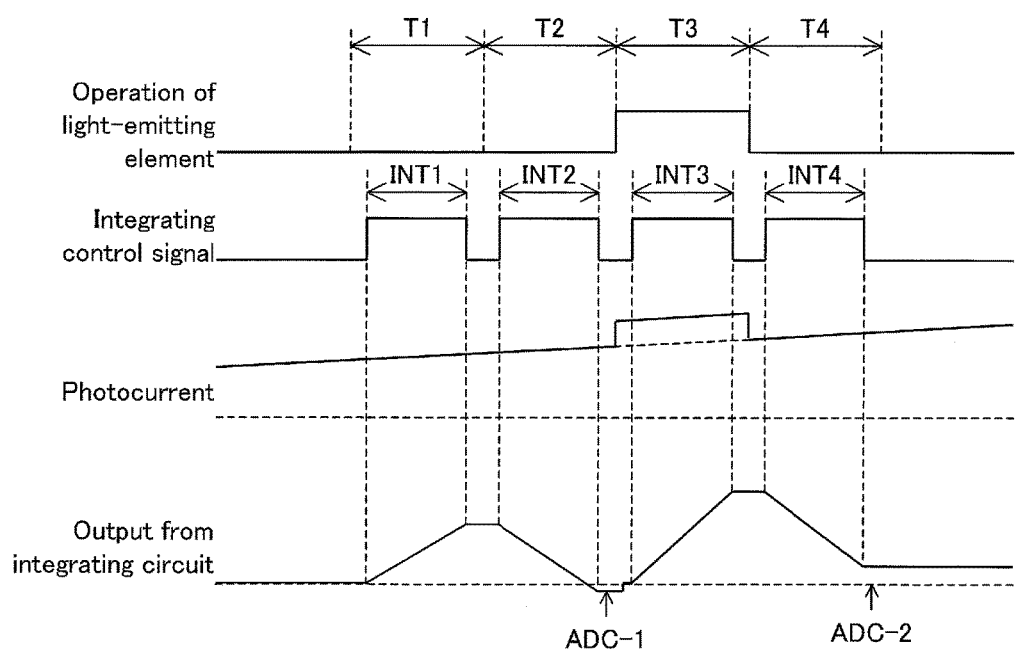
FIG. 8 is a timing chart showing a way in which the optical sensor operates in a case where increasing disturbance light is incident.
Figure 21:
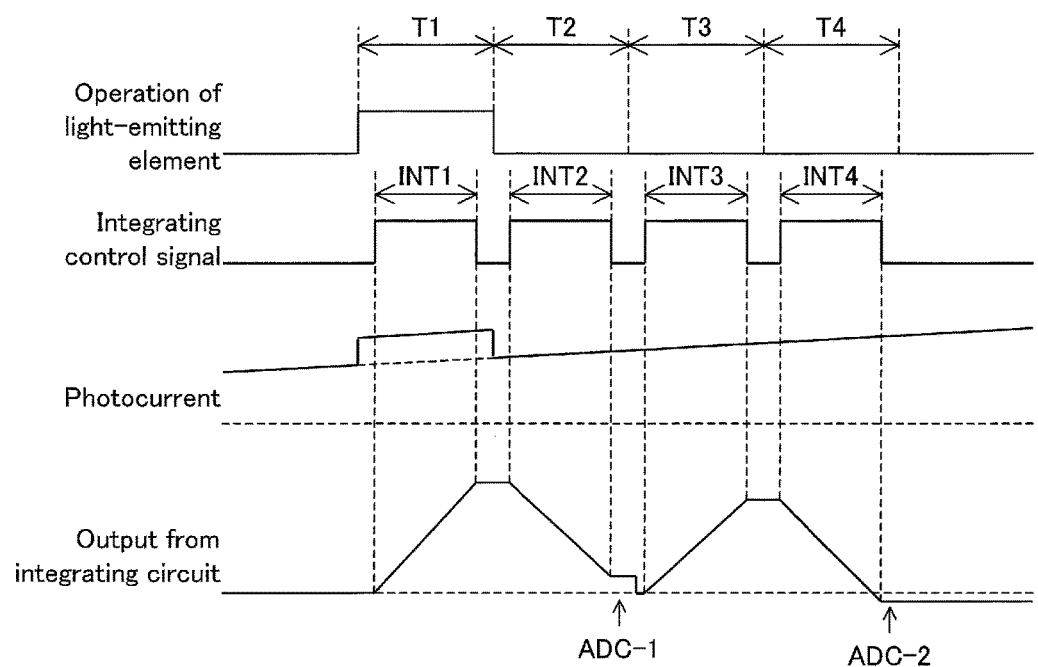
FIG. 21 is a timing chart showing another way in which the optical sensor according to Embodiment 1 operates in a case where increasing disturbance light is incident.

FIG. 8 is a timing chart showing a way in which the optical sensor 101 operates in a case where increasing disturbance light is incident. FIG. 21 is a timing chart showing another way in which the optical sensor 101 operates in a case where increasing disturbance light is incident.

In a case where disturbance light increases, as shown in FIG. 8, in the first period T1 and the second period T2 in the first driving pattern, the light-emitting LED is off; therefore, the photocurrent increases as the disturbance light increases. This causes the integrated value in the integral period INT2 to be larger than the integrated value in the integral period INT1. In this case, since the integrated value outputted from the integrating circuit 1 is a negative value, the digital integrated value ADC-1 outputted from the AV converter 2 is a negative value, too. When the digital integrated value ADC-1 is stored in the register 3a, the integrating circuit 1 is reset.

In the third period T3, the photocurrent obtained by the light-emitting element LED being turned on and the disturbance light are integrated in the integral period INT3. In the fourth period T4 that follows, only the disturbance light is integrated in the integral period INT4 by the light-emitting element LED being turned off. Further, the disturbance light component of the integrated value in the integral period INT4 becomes larger than the disturbance light component of the integrated value in the integral period INT3.

In this state, unlike in the case shown in FIG. 7, the reflected light component of the integrated value outputted from the integrating circuit 1 becomes smaller with the subtraction of the difference in disturbance light component between the integral periods INT3 and INT4. Accordingly, the digital integrated value ADC-2 becomes smaller, too. Further, since the integrated value outputted from the integrating circuit 1 is smaller than the set value of the first comparator 3b, the digital integrated value ADC-2 is stored in the register 3a by the register control circuit 3d.

In a case where disturbance light increases, since the second comparator 3c determines that the digital integrated value ADC-1 is negative, the digital integrated values ADC-1 and ADC-2 are read out from the register 3a. Then, as a result of subtraction of the negative digital integrated value ADC-1 from the digital integrated value ADC-2 by the subtracting circuit 3e, the decline in the digital integrated value ADC-2 is compensated for by the digital integrated value ADC-1.

In such a case where the disturbance light component of a photocurrent monotonically increases, a sensing signal based on an accurate reflected light component can be outputted through such a subtraction procedure as that described above.

In the example shown in FIG. 21, the light-emitting element LED is driven in the second driving pattern so that it is on during the first period and off during the second period T2 to the fourth period T4. In the example shown in FIG. 21, in the first period T1, the photocurrent obtained by the light-emitting element LED being turned on and the disturbance light are integrated in the integral period INT1.

In the second period T2 that follows, only the disturbance light is integrated in the integral period INT2 by the light-emitting element LED being turned off. Further, the disturbance light component of the integrated value in the integral period INT2 becomes larger than the disturbance light component of the integrated value in the integral period INT1.

In this state, as in the third period T3 and the fourth period T4 shown in FIG. 8, the reflected light component of the integrated value outputted from the integrating circuit 1 becomes smaller with the subtraction of the difference in disturbance light component between the integral periods INT1 and INT2. Accordingly, the digital integrated value ADC-1 becomes smaller, too. When the digital integrated value ADC-1 is stored in the register 3a, the integrating circuit 1 is reset.

In the third period T3 and the fourth period T4, during which the light-emitting element LED is off, the integrated value in the integral period INT4 becomes larger than the integrate value in the integral period INT3 by an increase in disturbance light. At this point in time, since the integrated value outputted from the integrating circuit 1 is a negative value, the digital integrated value ADC-2 outputted from the AD converter 2 is a negative value, too.

In this case, since the absolute value of the digital integrated value ADC-2 is smaller than the set value of the first comparator 3b, the register 3a is controlled by the register control circuit 3d so that the digital integrated value ADC-1 becomes able to be read out. Further, since the second comparator 3c determines that the digital integrated value ADC-2 is negative, the digital integrated values ADC-1 and ADC-2 are read out from the register 3a. Then, as a result of subtraction of the negative digital integrated value ADC-2 from the digital integrated value ADC-1 by the subtracting circuit 3e, the decline in the digital integrated value ADC-1 is compensated for by the digital integrated value ADC-2.

In this example, too, in a case where the disturbance light component of a photocurrent monotonically increases, a sensing signal based on an accurate reflected light component can be outputted through such a subtraction procedure as that described above.

(2) Case Where Disturbance Light Decreases

Figure 9:
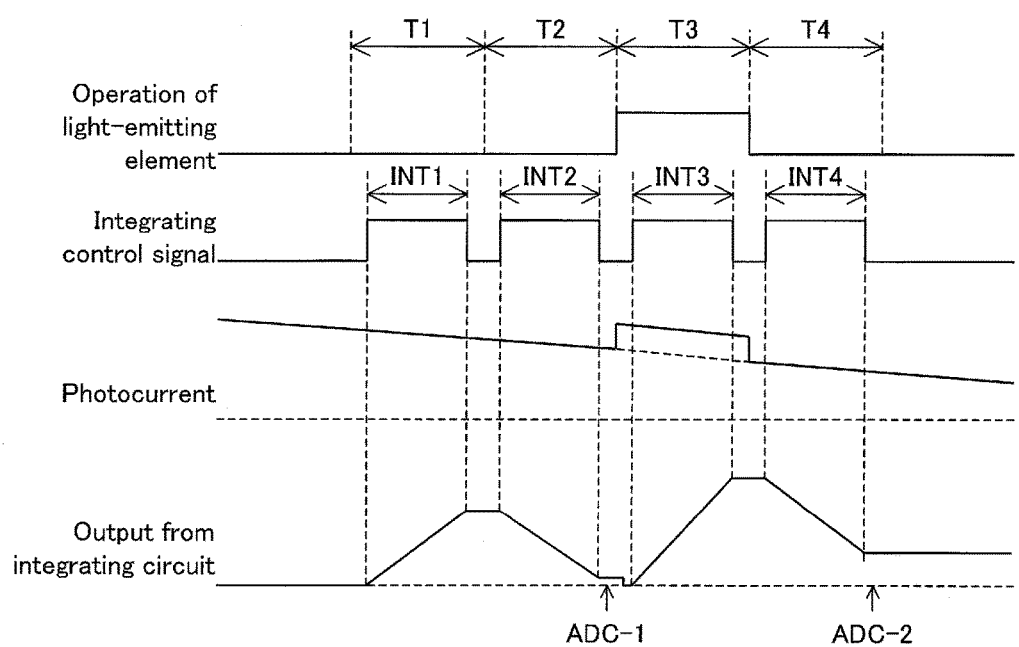
FIG. 9 is a timing chart showing a way in which the optical sensor operates in a case where decreasing disturbance light is incident.
Figure 22:
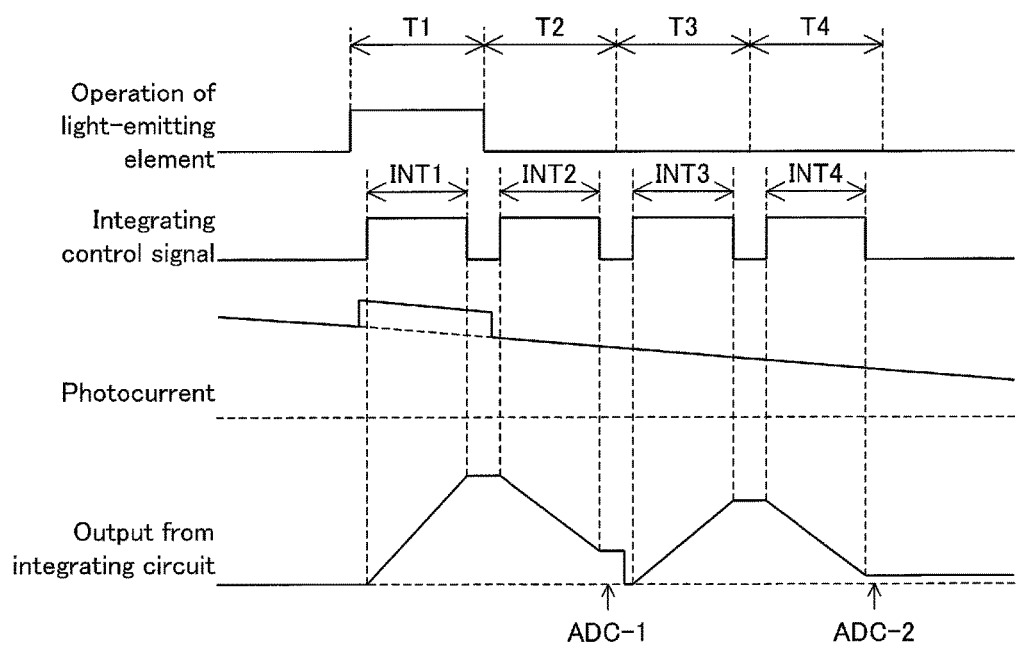
FIG. 22 is a timing chart showing another way in which the optical sensor according to Embodiment 1 operates in a case where decreasing disturbance light is incident.

FIG. 9 is a timing chart showing a way in which the optical sensor 101 operates in a case where decreasing disturbance light is incident. FIG. 22 is a timing chart showing another way in which the optical sensor 101 operates in a case where decreasing disturbance light is incident.

In a case where disturbance light decreases, as shown in FIG. 9, in the first period T1 and the second period T2 in the first driving pattern, the light-emitting LED is off; therefore, the photocurrent decreases as the disturbance light decreases. This causes the integrated value in the integral period INT2 to be smaller than the integrated value in the integral period INT1. In this case, since the integrated value outputted from the integrating circuit 1 is a positive value, the digital integrated value ADC-1 outputted from the AV converter 2 is a positive value, too. When the digital integrated value ADC-1 is stored in the register 3a, the integrating circuit 1 is reset.

In the third period T3, the photocurrent obtained by the light-emitting element LED being turned on and the disturbance light are integrated in the integral period INT3. In the fourth period T4 that follows, only the disturbance light is integrated in the integral period INT4 by the light-emitting element LED being turned off. Further, the disturbance light component of the integrated value in the integral period INT4 becomes smaller than the disturbance light component of the integrated value in the integral period INT3. In this state, unlike in the case shown in FIG. 7, the reflected light component of the integrated value outputted from the integrating circuit 1 becomes larger with the addition of the difference in disturbance light component between the integral periods INT3 and INT4. Accordingly, the digital integrated value ADC-2 becomes larger, too.

In this case, since the absolute value of the digital integrated value ADC-1 is smaller than the set value of the first comparator 3b, the digital integrated value ADC-2 is stored in the register 3a by the register control circuit 3d. Further, since the second comparator 3c determines that the digital integrated values ADC-1 is positive, the digital integrated values ADC-1 and ADC-2 are read out from the register 3a. Then, as a result of subtraction of the positive digital integrated value ADC-1 from the digital integrated value ADC-2 by the subtracting circuit 3e, the increase in the digital integrated value ADC-2 is canceled out by the digital integrated value ADC-1.

In such a case where the disturbance light component of a photocurrent monotonically decreases, a sensing signal based on an accurate reflected light component can be outputted through such a subtraction procedure as that described above.

In the example shown in FIG. 22, the light-emitting element LED is driven in the second driving pattern so that it is on during the first period and off during the second period T2 to the fourth period T4. In the example shown in FIG. 22, in the first period T1, the photocurrent obtained by the light-emitting element LED being turned on and the disturbance light are integrated in the integral period INT1. In the second period T2 that follows, only the disturbance light is integrated in the integral period INT2 by the light-emitting element LED being turned off. Further, the disturbance light component of the integrated value in the integral period INT2 becomes smaller than the disturbance light component of the integrated value in the integral period INT1.

In this state, as in the third period T3 and the fourth period T4 shown in FIG. 9, the reflected light component of the integrated value outputted from the integrating circuit 1 becomes larger with the addition of the difference in disturbance light component between the integral periods INT1 and INT2. Accordingly, the digital integrated value ADC-1 becomes larger, too. When the digital integrated value ADC-1 is stored in the register 3a, the integrating circuit 1 is reset.

In the third period T3 and the fourth period T4, during which the light-emitting element LED is off, the integrated value in the integral period INT4 becomes smaller than the integrate value in the integral period INT3 as the disturbance light decreases. In this case, since the integrated value outputted from the integrating circuit 1 is a positive value, the digital integrated value ADC-2 outputted from the AD converter 2 is a positive value, too. The digital integrated value ADC-2 is stored in the register 3a, too.

In this case, since the absolute value of the digital integrated value ADC-2 is smaller than the set value of the first comparator 3b, the register 3a is controlled by the register control circuit 3d so that the digital integrated value ADC-1 becomes able to be read out. Further, since the second comparator 3c determines that the digital integrated value ADC-2 is positive, the digital integrated values ADC-1 and ADC-2 are read out from the register 3a. Then, as a result of subtraction of the positive digital integrated value ADC-2 from the digital integrated value ADC-1 by the subtracting circuit 3e, the increase in the digital integrated value ADC-1 is canceled out by the digital integrated value ADC-2.

In this example, too, in a case where the disturbance light component of a photocurrent monotonically decreases, a sensing signal based on an accurate reflected light component can be outputted through such a subtraction procedure as that described above.

(3) Determination of Whether or Not to Perform a Sensing Operation

In a case where disturbance light increases (example shown in FIG. 8) and in a case where disturbance light decreases (example shown in FIG. 9), the absolute value of the digital integrated value ADC-1 may be equal to or larger than the set value, as the digital integrated value ADC-1 is not zero. In this case, the digital integrated value ADC-2 is not stored in the register 3a under the control of the register control circuit 3d. This makes it impossible to output a sensing signal, thus making it impossible to perform a sensing operation (non-sensing mode). Further, when the digital integrated value ADC-1 is smaller than the set value, the digital integrated value ADC-2 is stored in the register 3a under the control of the register control circuit 3d. This makes it possible to output a sensing signal in accordance with the digital integrated value ADC-2, thus making it possible to perform a sensing operation (sensing mode).

It should be noted that it is possible to regularly repeat the operation of integration in the integral periods INT1 and INT2 to determine whether or not the digital integrated value ADC-1 is smaller than the set value, and to change between the sensing mode and the non-sensing mode in accordance with a result of the determination.

In a case where disturbance light increases (example shown in FIG. 21) and in a case where disturbance light decreases (example shown in FIG. 22), the absolute value of the digital integrated value ADC-2 may be equal to or larger than the set value, as the digital integrated value ADC-2 is not zero. In this case, the digital integrated value ADC-1 is not read out from the register 3a under the control of the register control circuit 3d. This makes it impossible to output a sensing signal, thus making it impossible to perform a sensing operation (non-sensing mode). Further, when the digital integrated value ADC-2 is smaller than the set value, the digital integrated value ADC-1 is read out from the register 3a under the control of the register control circuit 3d. This makes it possible to output a sensing signal in accordance with the digital integrated value ADC-1, thus making it possible to perform a sensing operation (sensing mode).

It should be noted that it is possible to regularly repeat the operation of integration in the integral periods INT3 and INT4 to determine whether or not the digital integrated value ADC-2 is smaller than the set value, and to change between the sensing mode and the non-sensing mode in accordance with a result of the determination.

Embodiment 2

Embodiment 2 of the present invention is described below with reference to FIGS. 7 through 10 and FIGS. 20 through 22.

It should be noted that components of the present embodiment which have the same functions as those of the components of Embodiment 1 are given the same reference signs, and as such, are not described below.

(Configuration of an Optical Sensor)

Figure 10:
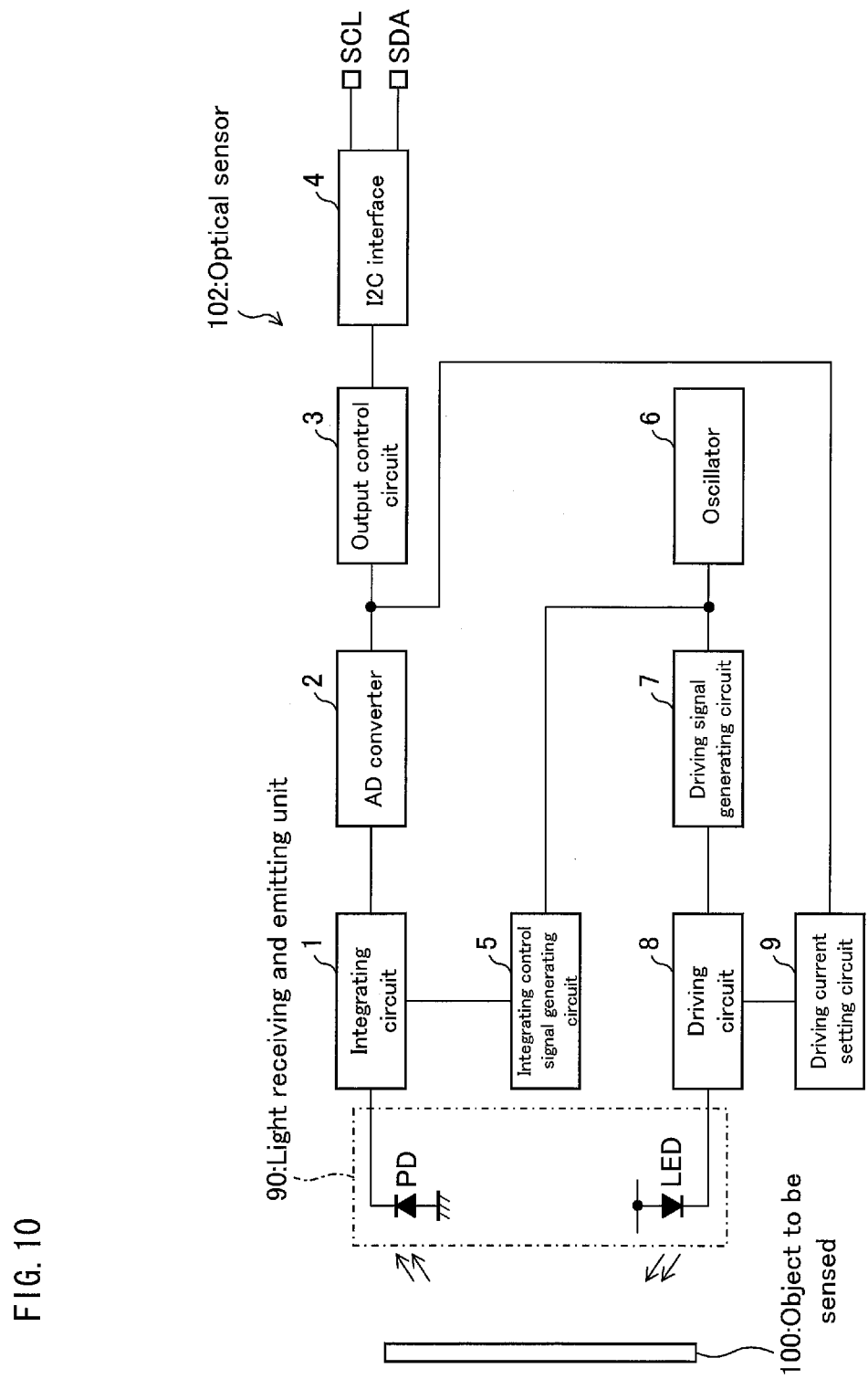
FIG. 10 is a block diagram showing a configuration of an optical sensor according to Embodiment 2 of the present invention.

FIG. 10 is a block diagram showing a configuration of an optical sensor 102 according to the present embodiment.

As shown in FIG. 10, the optical sensor 102, as with the optical sensor 101 described above, includes an integrating circuit 1, an AD converter 2, an output control circuit 3, an I2C interface 4, an integrating control signal generating circuit 5, an oscillator 6, a driving signal generating circuit 7, a driving circuit 8, and a light receiving and emitting unit 90. Further, the optical sensor 102 includes a driving current setting circuit 9.

The driving current setting circuit 9 (optical output control circuit) is a circuit that controls, in proportion to the absolute value of an integrated value which, of the digital integrated values ADC-1 and ADC-2 outputted from the AD converter 2, was integrated in a period during which the light-emitting element LED was off, a driving current that the driving circuit 8 generates.

(Operation of the Optical Sensor)

In the optical sensor 102 thus configured, the driving circuit 8 controls a driving current (optical output) in proportion to the absolute value of the digital integrated value ADC-1 or ADC-2, which is an integrated value integrated in a period during which the light-emitting LED was off. Specifically, in the examples shown in FIGS. 7 through 9, the driving circuit 8 controls a driving current in proportion to the absolute value of the digital integrated value ADC-1, and in the examples shown in FIGS. 20 through 22, the driving circuit 8 controls a driving current in proportion to the absolute value of the digital integrated value ADC-2. With this, the amount of light that is emitted by the light-emitting element LED is adjusted according to the amount of light received by the light-receiving element PD.

This makes it possible, even in the case of intense disturbance light, to ensure an S/N ratio sufficient for a sensing signal. Further, in the case of weak disturbance light, power consumption can be reduced by decreasing a driving current of the light-emitting element LED.

Embodiment 3

Embodiment 3 of the present invention is described below with reference to FIGS. 7 through 9, FIG. 11, and FIGS. 20 through 22.

It should be noted that components of the present embodiment which have the same functions as those of the components of Embodiment 1 are given the same reference signs, and as such, are not described below.

(Configuration of an Optical Sensor)

Figure 11:
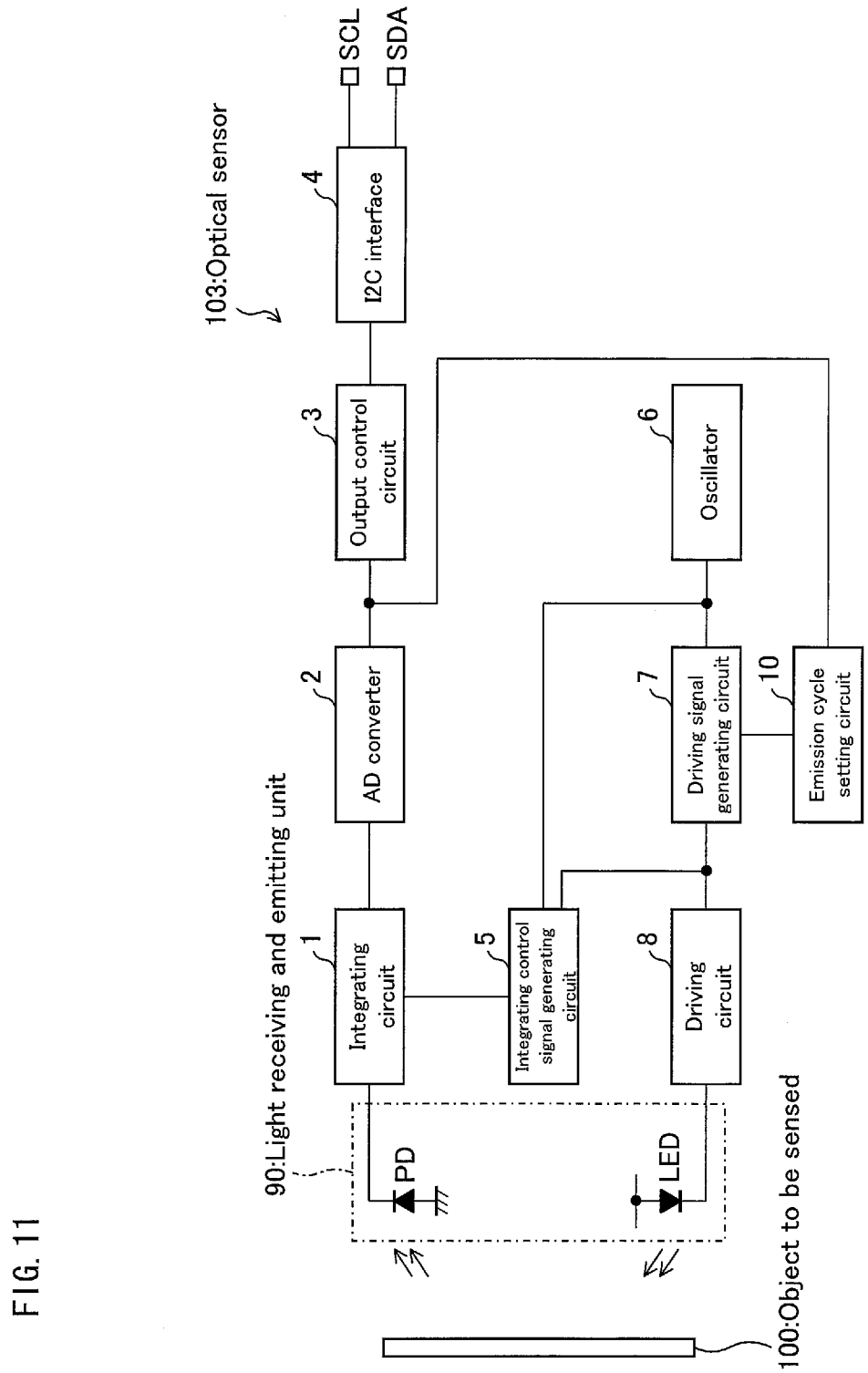
FIG. 11 is a block diagram showing a configuration of an optical sensor according to Embodiment 3 of the present invention.

FIG. 11 is a block diagram showing a configuration of an optical sensor 103 according to the present embodiment.

As shown in FIG. 11, the optical sensor 103, as with the optical sensor 101 described above, includes an integrating circuit 1, an AD converter 2, an output control circuit 3, an I2C interface 4, an integrating control signal generating circuit 5, an oscillator 6, a driving signal generating circuit 7, a driving circuit 8, and a light receiving and emitting unit 90. Further, the optical sensor 103 includes an emission cycle setting circuit 10.

The emission cycle setting circuit 10 (emission cycle control circuit) is a circuit that so sets the cycle (driving cycle) of a driving signal the driving signal generating circuit 7 generates that the absolute value of the digital integrated value ADC-1 which is outputted from the AD converter 2 is at a minimum.

(Operation of the Optical Sensor)

In the optical sensor 103 thus configured, the emission cycle setting circuit 10 controls the driving cycle in accordance with the absolute value of an integrated value which, of the digital integrated values ADC-1 and ADC-2, was integrated in a period during which the light-emitting element LED was off. Specifically, in the examples shown in FIGS. 7 through 9, the emission cycle setting circuit 10 controls the driving cycle in accordance with the absolute value of the digital integrated value ADC-1, and in the examples shown in FIGS. 20 through 22, the emission cycle setting circuit 10 controls the driving cycle in accordance with the absolute value of the digital integrated value ADC-2. With this, the emission cycle of the light-emitting element LED is adjusted, so that the integral periods INT1 to INT4 are adjusted. As a result, in the examples shown in FIGS. 7 through 9, the absolute value of the digital integrated value ADC-1 is at a minimum, and in the examples shown in FIGS. 20 through 22, the absolute value of the digital integrated value ADC-2 is at a minimum. At this point in time, for continuous adjustment of the driving cycle, the first period T1 and the second period T2 are repeated in the examples shown in FIGS. 7 through 9, and the third period T3 and the fourth period T5 are repeated in the examples shown in FIGS. 20 through 22.

Controlling the emission cycle in the manner described above makes it possible to maximize the rate of elimination of disturbance light in an environment in which disturbance light is generated. Possible examples of disturbance light here are as follows:

(a) DC light such as sunlight and light from a light source that shows little change in light intensity over a short period of time such a microseconds or milliseconds;

(b) light from a light source, such as an incandescent lamp or a fluorescent lamp, that has an intensity fluctuation at a commercial frequency of 50 Hz or 60 Hz;

(c) light from a light source, such as an inverter fluorescent lamp, that has an intensity fluctuation at approximately 50 Hz; and (d) light from a light source, such as a PWM (pulse-width modulated) LED light source, that has an intensity fluctuation at 20 kHz to several hundred kilohertz.

This makes it possible to improve the resistance of the optical sensor 103 to disturbance light.

In such a case as that mentioned above where constant disturbance light is present, the absolute value of the digital integrated value ADC-1 (example of the first driving pattern shown in FIG. 6) or the digital integrated value ADC-2 (example of the second driving pattern shown in FIG. 19) shows little change near zero even with a change in each of the integral periods INT1 to INT4. On the other hand, in the case of a change of the disturbance light component in each of the integral periods INT1 to INT4 (i.e. in the case of a temporal change of disturbance light as in the case of light from an inverter fluorescent lamp or the like), the emission cycle setting circuit 10 synchronizes each of the integral periods INT1 to INT4 with the cycle of the disturbance light. With this, in the case of the first driving pattern, the disturbance light component is canceled out by the difference in integral value between the integral periods INT1 and INT2 to be zero. Further, in the case of the second driving pattern, the disturbance light component is canceled out by the difference in integral value between the integral periods INT3 and INT4 to be zero.

Therefore, synchronizing each of the integral periods INT1 to INT4 with the cycle of the disturbance light by controlling the emission cycle and adjusting the integral periods INT1 to INT4 as described above makes it possible to adjust the absolute value of the digital integrated value ADC-1 or ADC-2 so that it is closest to zero. This makes it easy to cancel out the disturbance light component and detect only the reflected light component.

Embodiment 4

Embodiment 4 of the present invention is described below with reference to FIG. 2 and FIGS. 12 through 14.

It should be noted that components of the present embodiment which have the same functions as those of the components of Embodiment 1 are given the same reference signs, and as such, are not described below.

(Configuration of an Optical Sensor)

Figure 12:
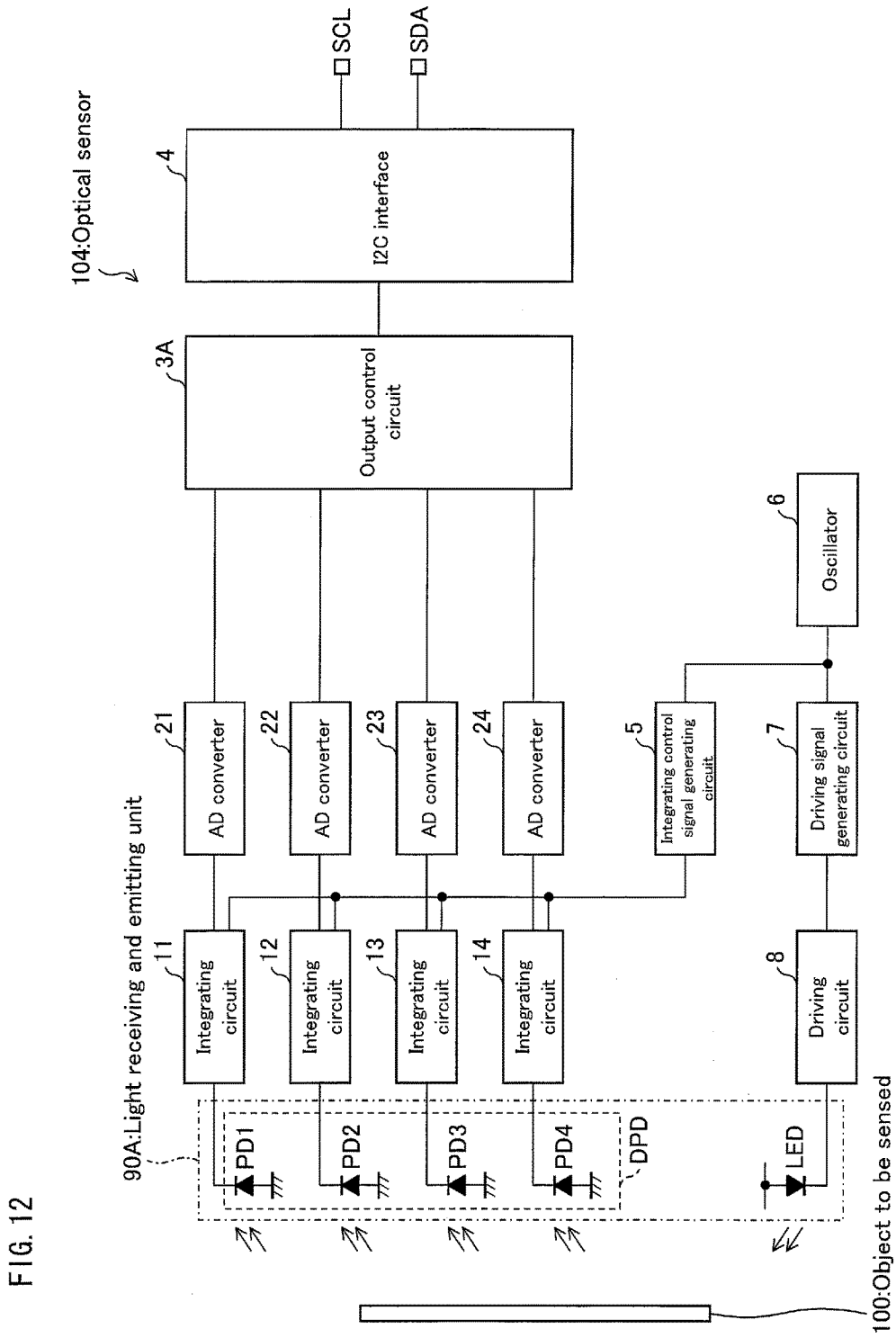
FIG. 12 is a block diagram showing a configuration of an optical sensor according to Embodiment 4 of the present invention.

As shown in FIG. 12, the optical sensor 104, as with the optical sensor 101 described above, includes an I2C interface 4, an integrating control signal generating circuit 5, an oscillator 6, a driving signal generating circuit 7, and a driving circuit 8. Further, instead of including an integrating circuit 1, an AD converter 2, an output control circuit 3, and a light receiving and emitting unit 90 as the optical sensor 101 does, the optical sensor 104 includes integrating circuits 11 to 14, AD converters 21 to 24, an output control circuit 3A, and a light receiving and emitting unit 90A. Furthermore, the optical sensor 104 includes a comparison circuit 151.

<Configuration of the Light Receiving and Emitting Unit>

Figure 13:
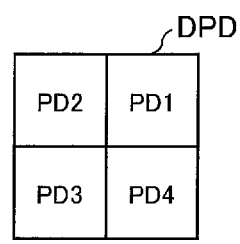
FIG. 13 is a plan view showing a configuration of a light-receiving element in the optical sensor of FIG. 12.

FIG. 2 is a longitudinal sectional view showing a mounting structure of a light-emitting element LED and a light-receiving element DPD of the light receiving and emitting unit 90A. FIG. 13 is a plan view showing a configuration of the light-receiving element DPD in the optical sensor 104.

As with the light receiving and emitting unit 90 in the optical sensor 101, the light receiving and emitting unit 90A includes the light-emitting element LED. Further, instead of including a light-receiving element PD as the optical sensor 101 does, the light receiving and emitting unit 90A includes the light-receiving element DPD. Furthermore, as shown in FIG. 2, in the light receiving and emitting unit 90A, the light-receiving element PDP is mounted in the same location as that in which the light-receiving element PD is mounted in the light receiving and emitting unit 90.

As shown in FIG. 13, the light-receiving element DPD is a four-part element constituted by four light-receiving elements PD1 to PD4 each having a square light-receiving region.

<Detection of Light by the Light-Receiving Element>

Figure 14:
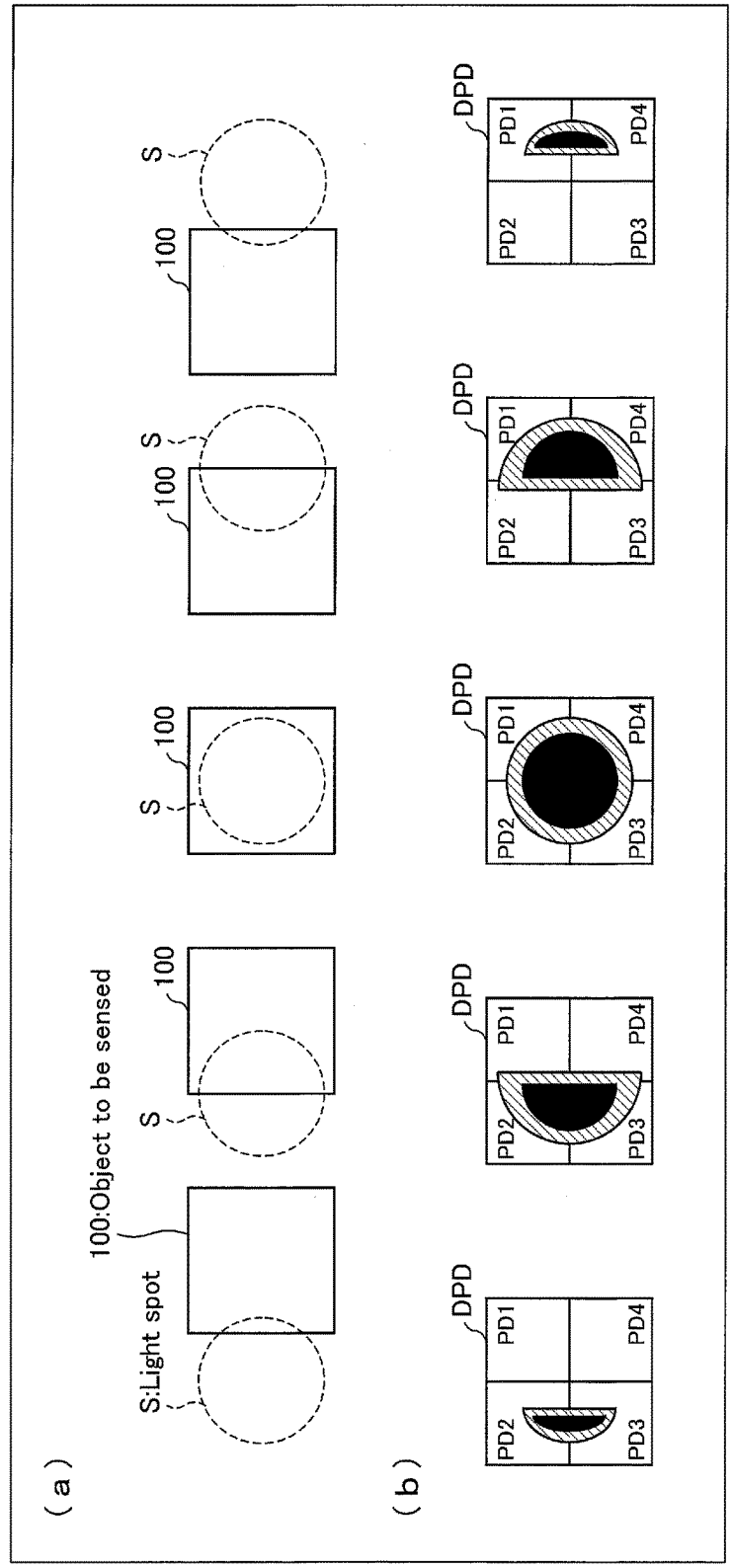
FIG. 14 is a set of diagrams (a) and (b), (a) being a plan view showing changes in positional relationship between a light spot formed by light emitted from the optical sensor of FIG. 12 and an object to be sensed, (b) being a plan view showing how light reflected from the object to be sensed reflecting the light spot is incident on the light-receiving element in the optical sensor of FIG. 12.

(a) of FIG. 14 is a plan view showing changes in positional relationship between a light spot formed by light emitted from the optical sensor 104 and an object to be sensed 100. (b) of FIG. 14 is a plan view showing how light reflected from the object to be sensed 100 reflecting the light spot is incident on the light-receiving element DPD in the optical sensor 104.

The use of the four-part light-receiving element DPD causes an image of light reflected (as a light spot S) from the object to be sensed 100 and projected onto the light-receiving element DPD to change shape depending on the position the object to be sensed 100 (see (a) and (b) of FIG. 14). Therefore, by measuring the amounts of light incident on the light-receiving elements PD1 to PD4 respectively, the position of the object to be sensed 100 with respect to the optical sensor 104 can be sensed.

A case is described here where, as shown in (a) of FIG. 14, an object to be sensed 100 moves in a direction from right to left with respect to a light spot S formed by light emitted from the light-emitting element LED. First, light reflected from the object to be sensed 100 reflecting the light spot S is projected onto the light-receiving element DPD as an inverted image by a light-receiving lens section 92b (convex lens) of the light receiving and emitting unit 90A.

In a state in which, as illustrated by the first and second pictures from the left in (a) of FIG. 14, the object to be sensed 100 is approaching from the right, the reflected light is projected onto the light-receiving elements PD2 and PD3. At this point in time, the light-receiving elements PD2 and PD3 each generate a photocurrent proportional to the intensity of the incident light. Further, in a state in which, as illustrated by the third picture from the left in (a) of FIG. 14, the object to be sensed 100 has reached such a position as to completely reflect the light spot S, the reflected light is projected onto the light-receiving elements PD1 to PD4. At this point in time, the light-receiving elements PD1 to PD4 each generate a photocurrent proportional to the intensity of the incident light. In a state in which, as illustrated by the fourth and fifth pictures from the left in (a) of FIG. 14, the object to be sensed 100 is moving away to the left, the reflected light is projected onto the light-receiving elements PD1 and PD4. At this point in time, the light-receiving elements PD1 and PD4 each generate a photocurrent proportional to the intensity of the incident light.

When the image of the reflected light projected onto the light-receiving element DPD thus changes shape depending on the position of the object to be sensed 100 with respect to the light spot S, the respective photocurrents of the light-receiving elements PD1 to PD4 of the light-receiving element DPD change accordingly. This makes it possible to determine a relative positional relationship between the optical sensor 104 and the object to be sensed 100 on the basis of the respective photocurrents of the light-receiving elements PD1 to PD4. This also makes it possible to, by calculating a temporal change in the position of the object to be sensed 100, detect the speed and direction of movement of the object to be sensed 100.

It should be noted, however, that accurate sensing of the position of the object to be sensed 100 requires operation that is free of the influence of disturbance light such as illuminating light or sunlight.

It should be noted that in (b) of FIG. 14, black and shaded portions of the image projected on the light-receiving element DPD indicate high-intensity and low-intensity portions, respectively.

<Configuration of the Integrating Circuits and the AD Converters>

The integrating circuits 11 to 14 are identical in configuration to the integrating circuit 1 of the optical sensor 101 described above. Further, the AD converters 21 to 24 are identical in configuration to the AD converter 2 of the optical sensor 101.

<Configuration of the Output Control Circuit>

As with the output control circuit 3 in the optical sensor 101, the output control circuit 3A has such a configuration as that shown in FIG. 3. Further, the output control circuit 3A further includes a circuit that performs arithmetic processing on digital integrated values ADC-1 and ADC-2 outputted from each of the AD converters 21 to 24. The arithmetic processing is described below.

The output control circuit 3A calculates digital integrated values ADC-1(T) and ADC-2(T) by performing the following computations on the digital integrated values ADC-1 and ADC-2 corresponding to the light-receiving elements PD1 to PD4, respectively:

$$ADC\text{-}1(T)=(ADC\text{-}1(1)+ADC\text{-}1(4))-(ADC\text{-}1(2)+ADC\text{-}2(3));$$

and $$ADC\text{-}2(T)=(ADC\text{-}2(1)+ADC\text{-}2(4))-(ADC\text{-}2(2)+ADC\text{-}2(3)),$$

where ADC-1(1) to ADC-1(4) represent the digital integrated values ADC-1 corresponding to the light-receiving elements PD1 to PD4, respectively, and ADC-2(1) to ADC-2(4) represent the digital integrated values ADC-2 corresponding to the light-receiving elements PD1 to PD4, respectively.

In the example shown in (b) of FIG. 14, the foregoing computations cause the digital integrated values ADC-1(T) and ADC-2(T) to be negative in the case of approach from the right, positive in the case of approach from the left, and zero in the case of completely reflected light.

(Operation of the Optical Sensor)

The light-emitting element LED emits light in the same manner as the light-emitting element LED in the optical sensor 101 to output an infrared optical pulse.

When the object to be sensed 100 comes closer to the optical sensor 104 to reach a position on the light spot S of the light emitted from the light-emitting element LED, the light emitted from the light-emitting element LED is reflected by the object to be sensed 100. The closer the object to be sensed 100 comes to the optical sensor 104, the larger the amount of light reflected from the object to be sensed 100 becomes.

When the object to be sensed 100 reaches a position where it completely reflects the light spot S and reflects all of the light emitted from the light-emitting element LED, the object to be sensed 100 is closest to the optical sensor 104. In this state, the amount of reflected light is at a maximum. The light-receiving elements PD1 to PD4 of the light-receiving element DPD receive light reflected from the object to be sensed 100, whereby the amounts of incident light increase. When the amounts of incident light exceed a specified threshold value and the light-receiving elements PD1 to PD4 are turned on, the light-receiving elements PD1 to PD4 generate photocurrents.

In the optical sensor 104, the photocurrents generated by the light-receiving elements PD1 to PD4 are integrated by the integrating circuits 11 to 14, respectively. Integrated values from the integrating circuits 11 to 14 are converted by the AD converters 21 to 24, respectively, into digital integrated values ADC-1 and ADC-2.

Further, the output control circuit 3A performs the aforementioned computations on the digital integrated values ADC-1 and ADC-2 outputted from the AD converters 21 to 24. This gives an integrated value of a polarity that has magnitude corresponding to the degree of proximity of the object to be sensed 100 and that corresponds to the direction in which the object to be sensed 100 comes close. Then, a sensing signal to sense the approach of the object to be sensed 100 is outputted by the output control circuit 3A in accordance with the integrated value. In the output control circuit 3A, the speed of movement of the object to be sensed 100 can be detected by calculating a temporal change in the position of the object to be sensed 100.

Furthermore, serial data SDA based on the sensing signal is outputted from the I2C interface 4 in synchronization with a serial clock SCL sent from an outside source.

As with the optical sensor 101, the optical sensor 104 can sense the approach of the object to be sensed 100. Further, by including the four-part integrating circuit DPD, the integrating circuits 11 to 14, the AD converters 21 to 24, and the output control circuit 3A, the optical sensor 104 can accurately sense a movement of the object to be sensed 100.

Moreover, by including the output control circuit 3A, the optical sensor 104, as with the optical sensor 101, performs such processes as those shown in FIGS. 7 through 9 or FIGS. 20 through 22 even in an environment in which disturbance light is generated. This makes it possible to accurately sense the position of the object to be sensed 100 without being affected by disturbance light.

The optical sensor 104 is in a state of intense disturbance light when the largest one of the absolute values of the digital integrated values ADC-1 or ADC-2 outputted from the respective AD converters 21 to 24 (i.e. the integrated values of the reflected light component from the object to be sensed 100) becomes equal to or larger than a set value set in advance. In the case of the first driving pattern, the output control circuit 3A does not store (update) the digital integrated values ADC-2 from the respective AD converters 21 to 24 in a register thereof (which corresponds to the register 3a). On the other hand, in the case of the second driving pattern, the output control circuit 3A stores the digital integrated values ADC-1 from the respective AD converters 21 to 24 in the register, but does not output the digital integrated values ADC-1. With this, the optical sensor 104, as with the optical sensor 101, shifts to the non-sensing mode, in which a sensing operation is not performed.

Further, in the case of the first driving pattern, the optical sensor 104 may, as with the optical sensor 101, continuously obtain the digital integrated value ADC-1 by regularly repeating the first period T1 and the second period T2 and, when the digital integrated value ADC-1 becomes smaller than the set value, may shift from the non-sensing mode to the sensing mode. On the other hand, in the case of the second driving pattern, the optical sensor 104 may, as with the optical sensor 101, continuously obtain the digital integrated value ADC-2 by regularly repeating the first period T3 and the second period T4 and, when the digital integrated value ADC-2 becomes smaller than the set value, may shift from the non-sensing mode to the sensing mode.

In the present embodiment, the light-receiving element DPD is one divided into four light-receiving elements. Without being limited to this, the light-receiving element DPD may be one divided into more than four light-receiving elements.

Embodiment 5

Embodiment 5 of the present invention is described below with reference to FIG. 15.

It should be noted that components of the present embodiment which have the same functions as those of the components of Embodiments 2 and 4 are given the same reference signs, and as such, are not described below.

(Configuration of an Optical Sensor)

Figure 15:
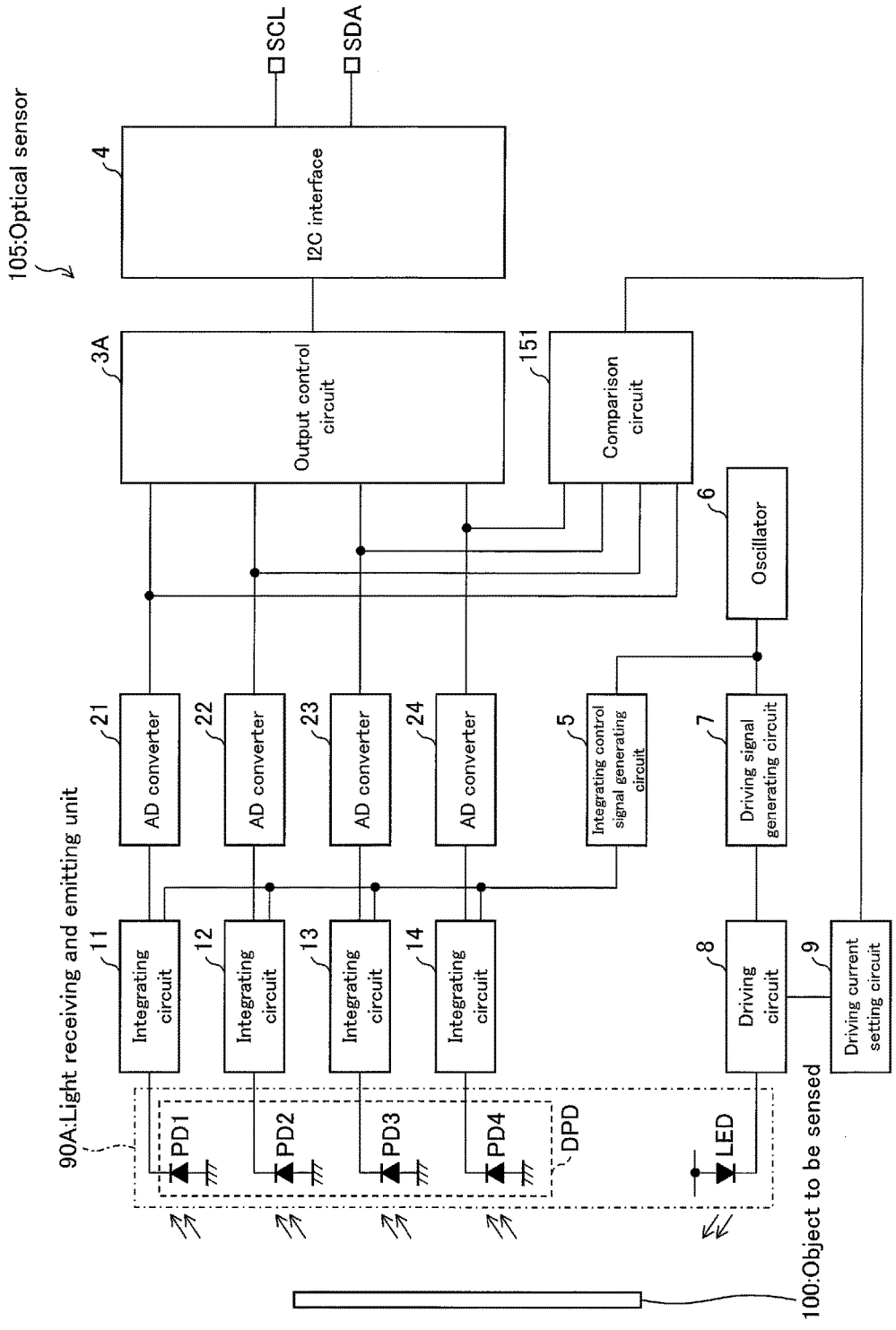
FIG. 15 is a block diagram showing a configuration of an optical sensor according to Embodiment 5 of the present invention.

As shown in FIG. 15, an optical sensor 105, as with the optical sensor 104 described above, includes integrating circuits 11 to 14, AD converters 21 to 24, an output control circuit 3A, an I2C interface 4, an integrating control signal generating circuit 5, an oscillator 6, a driving signal generating circuit 7, and a driving circuit 8. Further, in addition to including a driving current setting circuit 9 as the optical sensor 102 (Embodiment 2) does, the optical sensor 105 includes a comparison circuit 151.

<Configuration of the Comparison Circuit>

The comparison circuit 151 is a circuit that compares the absolute values of digital integrated values ADC-1 (first driving pattern) or digital integrated values ADC-2 outputted from the AD converters 21 to 24 and outputs the largest absolute value. Specifically, the comparison circuit 151 chooses one of the four absolute values as a reference value and compares the reference value with the other three absolute values. If having determined that the reference value is larger than the three absolute values, the comparison circuit 151 outputs the reference value as the largest absolute value. Alternatively, if having determined that the reference value is smaller than the three absolute values, the comparison circuit 151 chooses one of the three absolute values as a new reference value and performs a similar determination. By repeating a similar process as needed, the comparison circuit 151 finally determines and outputs the largest absolute value.

<Configuration of the Driving Current Setting Circuit>

The driving current setting circuit 9 has basically the same functions as those of the driving current setting circuit 9 in the optical sensor 102. However, the driving current setting circuit 9 receives the largest one of the absolute values of the digital integrated values ADC-1 from the comparison circuit 151 and sets, in proportion to the largest absolute value, a driving current that the driving circuit 8 generates.

(Operation of the Optical Sensor)

In the optical sensor 105 thus configured, the comparison circuit 151 determines and outputs the largest one of the absolute values of the digital integrated values ADC-1 or ADC-2 outputted from the respective AD converters 21 to 24. Then, the driving circuit 8 controls a driving current in proportion of the largest one of the absolute values of the digital integrated values ADC-1 or ADC-2. With this, the amount of light that is emitted by the light-emitting element LED is adjusted according to the amount of light received by the light-receiving element DPD.

This makes it possible, even in the case of intense disturbance light, to ensure an S/N ratio sufficient for a sensing signal. Further, in the case of weak disturbance light, power consumption can be reduced by decreasing a driving current of the light-emitting element LED.

Embodiment 6

Embodiment 6 of the present invention is described below with reference to FIG. 16.

It should be noted that components of the present embodiment which have the same functions as those of the components of Embodiments 3 and 5 are given the same reference signs, and as such, are not described below.

(Configuration of an Optical Sensor)

Figure 16:
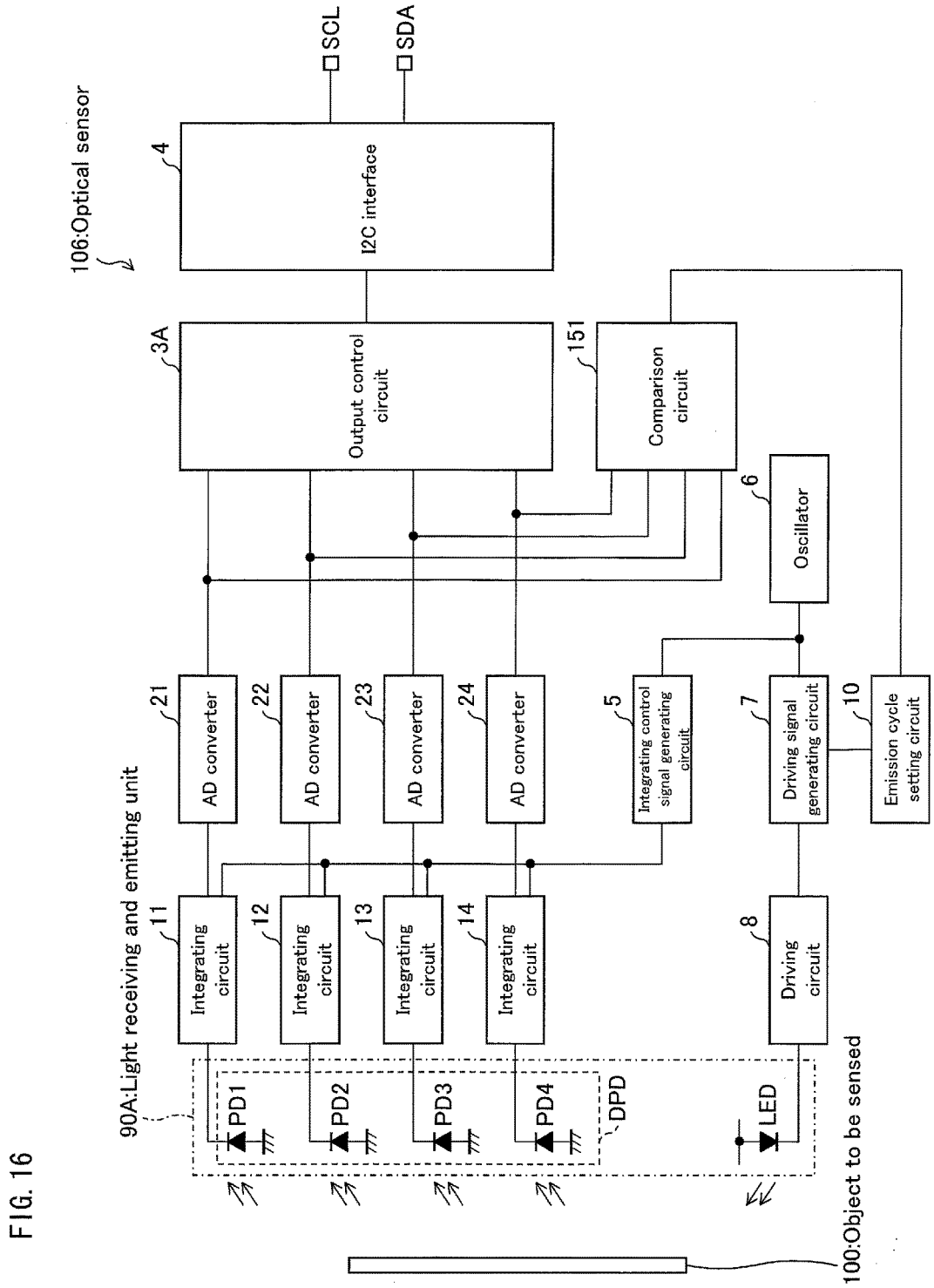
FIG. 16 is a block diagram showing a configuration of an optical sensor according to Embodiment 6 of the present invention.

As shown in FIG. 16, an optical sensor 106, as with the optical sensor 105 described above, includes integrating circuits 11 to 14, AD converters 21 to 24, an output control circuit 3A, an I2C interface 4, an integrating control signal generating circuit 5, an oscillator 6, a driving signal generating circuit 7, and a driving circuit 8. Further, as with the optical sensor 103 (Embodiment 3), the optical sensor 106 includes an emission cycle setting circuit 10.

The emission cycle setting circuit 10 has basically the same functions as those of the emission cycle setting circuit 10 in the optical sensor 103. However, the emission cycle setting circuit 10 receives the largest one of the absolute values of the digital integrated values ADC-1 from the comparison circuit 151 and so sets the cycle (driving cycle) of a driving signal the driving signal generating circuit 7 generates that the largest absolute value is at a minimum.

(Operation of the Optical Sensor)

In the optical sensor 106 thus configured, the emission cycle setting circuit 10 controls the driving cycle in accordance with the largest one of the absolute values of the digital integrated values ADC-1 (first driving pattern) or the digital integrated values ADC-2 (second driving pattern). With this, upon adjustment of the emission cycle, the integral periods INT1 to INT4 are adjusted. As a result, the largest one of the absolute values of the digital integrated values ADC-1 or the digital integrated values ADC-2 is at a minimum. At this point in time, for continuous adjustment of the driving cycle, the first period T1 and the second period T2 are repeated in the first driving pattern, and the third period T3 and the fourth period T5 are repeated in the second driving pattern.

Controlling the emission cycle in the manner described above makes it possible to maximize the rate of elimination of disturbance light in an environment in which disturbance light is generated. This makes it possible to improve the resistance of the optical sensor 106 to disturbance light.

Embodiment 7

Embodiment 6 of the present invention is described below with reference to FIG. 17.

It should be noted that components of the present embodiment which have the same functions as those of the components of Embodiments 1 to 6 are given the same reference signs, and as such, are not described below.

Figure 17:
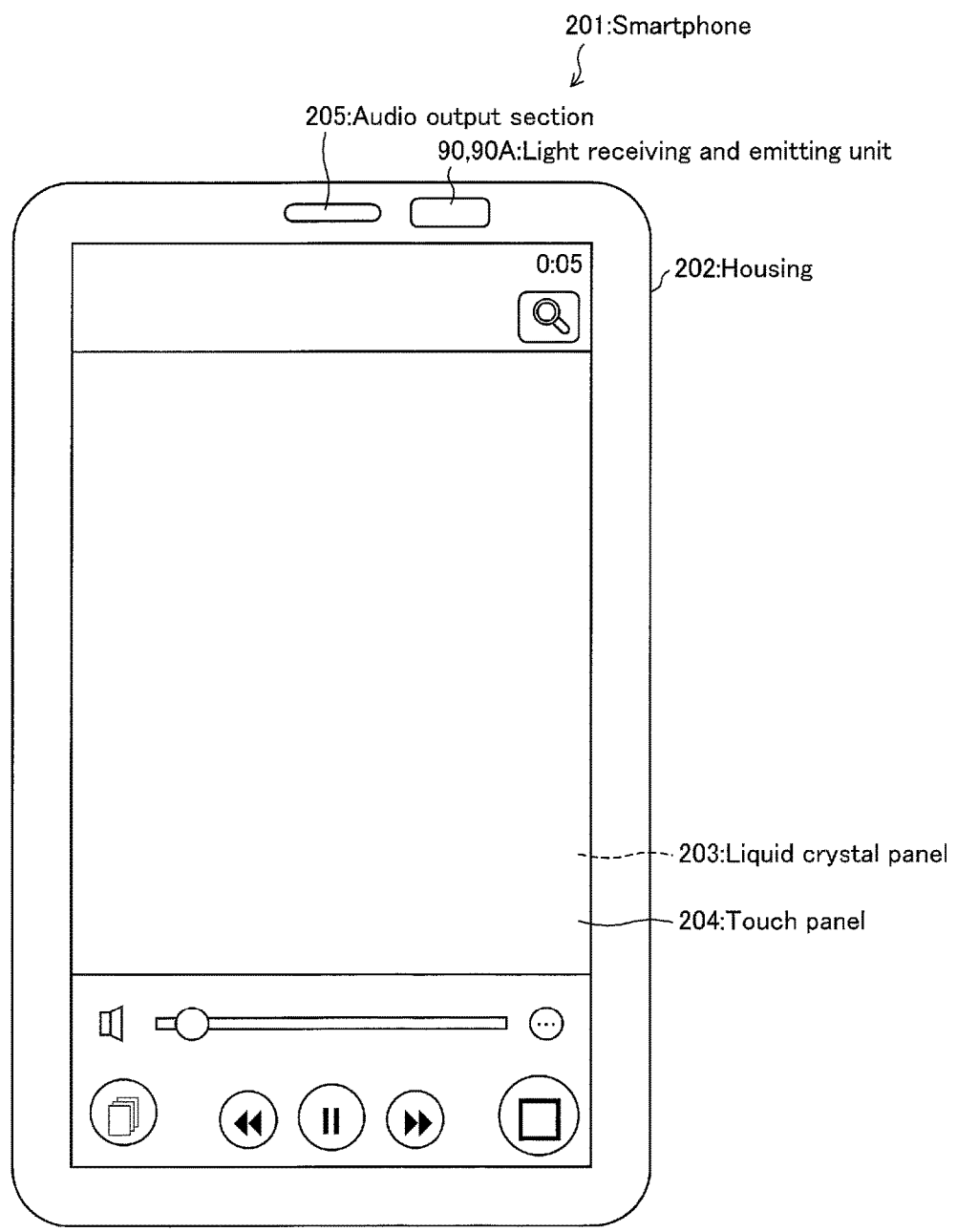
FIG. 17 is a plan view showing a configuration of a smartphone according to Embodiment 7 of the present invention.
Figure 18:
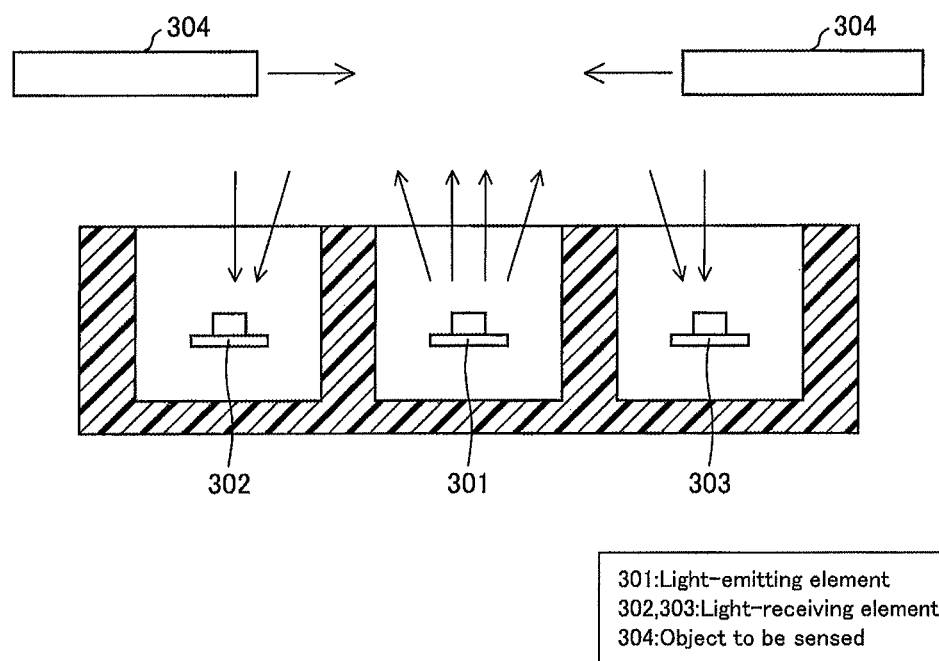
FIG. 18 is a longitudinal sectional view showing a conventional optical sensor.

FIG. 17 is a plan view showing a configuration of a smartphone according to Embodiment 7 of the present invention.

As shown in FIG. 17, a smartphone 201 as an electronic device is constituted through the incorporation of a liquid crystal panel 203 and a touch panel 204 into a housing 202. In the smartphone 201, the liquid crystal panel 203 is provided on a side of the housing that faces in the same direction as an operation screen. Further, the touch panel 204 is provided on the liquid crystal panel 203.

Provided in a part of the housing 202 that is above the operation screen are an audio output section 205 and a light receiving and emitting unit 90 or 90A. The audio output section 205 is provided to output voices in a case where the smartphone 201 is used as a telephone and to output various types of sound according to operation of application programs.

The light receiving and emitting unit 90 or 90A is a light-receiving section provided to sense the approach of an object to be sensed 100 (e.g. the face of a user) and to sense a gesture operation. Further, in a case where the smartphone 201 includes the light receiving and emitting unit 90, the smartphone 201 also contains any one of the optical sensors 101 to 103. Alternatively, in a case where the smartphone 201 includes the light receiving and emitting unit 90A, the smartphone 201 also contains any one of the optical sensors 104 to 106.

By thus including any one of the optical sensors 101 to 106, the smartphone 201 can, even in an environment in which disturbance light is generated, accurately sense the position of an object to be sensed 100 without being affected by the disturbance light.

SUMMARY

In a first aspect of the present invention, an optical sensor (optical sensors 101 to 106) includes: a light-emitting element (light-emitting element LED); a light-receiving element (light-receiving element PD, DPD) that generates a photocurrent upon receiving reflected light from an object to be sensed reflecting light emitted by the light-emitting element; a driving circuit (driving circuit 8) that causes the light-emitting element to be on or off during a first period (first period T1), a second period (second period T2), and a fourth period (fourth period T4) and that causes the light-emitting element to be off or on during a third period (third period T3), the first period, the second period, the third period, and the fourth period following one after the other; an integrating circuit (integrating circuit 1, integrating circuits 11 to 14) that outputs a first integrated-value difference and a second integrated-value difference, the first integrated-value difference being a difference between an integrated value of the photocurrent generated in accordance with a state of the light-emitting element during the first period and an integrated value of the photocurrent generated in accordance with a state of the light-emitting element during the second period, the second integrated-value difference being a difference between an integrated value of the photocurrent generated in accordance with a state of the light-emitting element during the third period and an integrated value of the photocurrent generated in accordance with a state of the light-emitting element during the fourth period; and an output control circuit (output control circuit 3, 3A) that outputs the second integrated-value difference when the first integrated-value difference is zero and that outputs a difference between the second integrated-value difference and the first integrated-value difference when the first integrated-value difference is not zero.

In the configuration described above, the integrating circuit yields the first integrated-value difference and the second integrated-value difference. In a case where the optical sensor is in an environment where disturbance light is generated, the light-receiving element receives the disturbance light as well as the light reflected from the object to be sensed. For example, in a case where the light-emitting element is off during the first period, the second period, and the fourth period and on during the third period, the first integrated-value difference becomes zero because a component formed by the disturbance light is cancelled out, and the second integrated-value difference is left with only a component formed by the reflected light because a component constituted by the disturbance light is cancelled out, provided the amount of disturbance light is constant. Further, in a state where the amount of disturbance light changes, the first integrated-value difference does not become zero because a component formed by the disturbance light is not cancelled out, and the second integrated-value difference is left with both a component formed by the reflected light and a component formed by the disturbance light because the component formed by the disturbance light is not cancelled out.

In a case where the first integrated-value difference is zero, the output control circuit outputs the second integrated-value difference, so that a sensing signal based solely on the reflected light component can be obtained with the disturbance light component not included. On the other hand, in a case where the first integrated-value difference is not zero, the output control circuit outputs the difference between the second integrated-value difference and the first integrated-value difference, so that a sensing signal based solely on the reflected light component canceled out with the disturbance light component canceled out.

This makes it possible to, without being affected by disturbance light, accurately sense the position and movement of an object to be sensed.

Further, the optical sensor is preferably configured such that: the light-receiving element comprises a plurality of light-receiving elements (light-receiving elements PD1 to PD4); and the integrating circuit comprises the same number of integrating circuits (integrating circuits 11 to 14) as the number of light-receiving elements so as to output the first integrated-value difference and the second integrated-value difference for a photocurrent of each light-receiving region.

The configuration described above, in which the plurality of light-receiving elements are provided, makes it possible to sense, on the basis of the amounts of light received by the respective light-receiving elements, a movement of and a direction of movement of the object to be sensed.

The optical sensor is preferably configured such that the output control circuit updates the second integrated-value difference when an absolute value of the first integrated-value difference is smaller than a threshold value set in advance and does not update the second integrated-value difference when the absolute value of the first integrated-value difference is not smaller than the threshold value.

Further, when having a plurality of light-receiving elements, the optical sensor is preferably configured such that: the output control circuit updates the second integrated-value difference when the largest one of absolute values of first integrated-value differences outputted from the respective integrating circuits is smaller than a threshold value set in advance; and the output control circuit does not update the second integrated-value difference when the absolute value of the first integrated-value difference is not smaller than the threshold value.

In the configuration described above, the output control circuit updates and outputs the second integrated-value difference when an absolute value of the first integrated-value difference is smaller than a threshold value set in advance. In this case, it is possible to obtain such a sensing signal as that described above on the basis of the latest second integrated-value difference and perform a sensing operation (sensing mode). On the other hand, the output control circuit does not update the second integrated-value difference when the absolute value of the first integrated-value difference is smaller than the threshold value. In this case, since the second integrated-value difference is not updated, such a sensing operation cannot be performed (non-sensing mode). This makes it possible to not perform a sensing operation in a case where the absolute value of the first integrated-value difference is too large and therefore inappropriate for a sensing operation to be normally performed.

The optical sensor is preferably configured to further include an optical output control circuit (driving current setting circuit 9) that controls an optical output from the light-emitting element in proportion to the first integrated-value difference.

Further, when having a plurality of light-receiving elements, the optical sensor is preferably configured to further include an optical output control circuit that controls an optical output from the light-emitting element in proportion to the largest one of absolute values of first integrated-value differences outputted from the respective integrating circuits.

In the configuration described above, the optical output control circuit controls the optical output from the light-emitting element in proportion to the first integrated-value difference. With this, the amount of light that is emitted by the light-emitting element is adjusted according to the amount of light received by the light-receiving element. This makes it possible, even in the case of intense disturbance light, to ensure an S/N ratio sufficient for a sensing signal. Further, in the case of weak disturbance light, power consumption can be reduced by decreasing a driving current of the light-emitting element LED.

The optical sensor is preferably configured to further include an emission cycle control circuit (emission cycle setting circuit 10) that controls an emission cycle so that an absolute value of the first integrated-value difference is at a minimum.

Further, when having a plurality of light-receiving elements, the optical sensor is preferably configured to further include an emission cycle control circuit (emission cycle setting circuit 10) that controls an emission cycle so that absolute values of first integrated-value differences outputted from the respective integrating circuits are at a minimum.

In the configuration described above, the emission cycle control circuit controls the emission cycle of the light-emitting element so that the absolute values of the first integrated-value differences are at a minimum. This makes it possible to approximate the absolute values of the first integrated-value differences to zero even in a case where disturbance light changes. This can facilitate the process of taking out only the reflected light component by eliminating the disturbance light component.

In a second aspect of the present invention, an optical sensor (optical sensors 101 to 106) includes: a light-emitting element (light-emitting element LED); a light-receiving element (light-receiving element PD, DPD) that generates a photocurrent upon receiving reflected light from an object to be sensed reflecting light emitted by the light-emitting element; a driving circuit (driving circuit 8) that causes the light-emitting element to be on or off during a first period (first period T1) and that causes the light-emitting element to be off or on during a second period (second period T2), a third period (third period T3), and a fourth period (fourth period T4), the first period, the second period, the third period, and the fourth period following one after the other; an integrating circuit (integrating circuit 1, integrating circuits 11 to 14) that outputs a first integrated-value difference and a second integrated-value difference, the first integrated-value difference being a difference between an integrated value of the photocurrent generated in accordance with a state of the light-emitting element during the first period and an integrated value of the photocurrent generated in accordance with a state of the light-emitting element during the second period, the second integrated-value difference being a difference between an integrated value of the photocurrent generated in accordance with a state of the light-emitting element during the third period and an integrated value of the photocurrent generated in accordance with a state of the light-emitting element during the fourth period; and an output control circuit (output control circuit 3, 3A) that outputs the first integrated-value difference when the second integrated-value difference is zero and that outputs a difference between the first integrated-value difference and the second integrated-value difference when the second integrated-value difference is not zero.

In the configuration described above, too, the integrating circuit yields the first integrated-value difference and the second integrated-value difference. For example, in a case where the light-emitting element is on during the first period and off during the second period to the fourth period, the first integrated-value difference is left with only a component formed by the reflected light because a component constituted by the disturbance light is cancelled out, and the second integrated-value difference becomes zero because a component formed by the disturbance light is cancelled out, provided the amount of disturbance light is constant. Further, in a state where the amount of disturbance light changes, the first integrated-value difference is left with both a component formed by the reflected light and a component formed by the disturbance light because the component formed by the disturbance light is not cancelled out, the second integrated-value difference does not become zero because a component formed by the disturbance light is not cancelled out.

In a case where the second integrated-value difference is zero, the output control circuit outputs the first integrated-value difference, so that a sensing signal based solely on the reflected light component can be obtained with the disturbance light component not included. On the other hand, in a case where the second integrated-value difference is not zero, the output control circuit outputs the difference between the first integrated-value difference and the second integrated-value difference, so that a sensing signal based solely on the reflected light component can be obtained with the disturbance light component canceled out.

This makes it possible to accurately sense the position and movement of an object to be sensed, without being affected by disturbance light.

Further, the optical sensor is preferably configured such that: the light-receiving element comprises a plurality of light-receiving elements (light-receiving elements PD1 to PD4); and the integrating circuit comprises the same number of integrating circuits (integrating circuits 11 to 14) as the number of light-receiving elements so as to output the first integrated-value difference and the second integrated-value difference for a photocurrent of each light-receiving region. The subsequent optical sensors are of course applicable to the optical sensor having a plurality of light-receiving elements as well as the optical sensor of the second aspect.

In the second aspect, the optical sensor is preferably configured such that the output control circuit outputs the first integrated-value difference when an absolute value of the second integrated-value difference is smaller than a threshold value set in advance and does not output the first integrated-value difference when the absolute value of the second integrated-value difference is not smaller than the threshold value.

In the configuration described above, the output control circuit updates and outputs the first integrated-value difference when an absolute value of the second integrated-value difference is smaller than a threshold value set in advance. In this case, it is possible to obtain such a sensing signal as that described above on the basis of the latest first integrated-value difference and perform a sensing operation (sensing mode). On the other hand, the output control circuit does not output the first integrated-value difference when the absolute value of the second integrated-value difference is smaller than the threshold value. In this case, since the latest first integrated-value difference is not outputted, such a sensing operation cannot be performed (non-sensing mode). This makes it possible to not perform a sensing operation in a case where the absolute value of the second integrated-value difference is too large and therefore inappropriate for a sensing operation to be normally performed.

In the second aspect, the optical sensor is preferably configured to further include an optical output control circuit (driving current setting circuit) that controls an optical output from the light-emitting element in proportion to the second integrated-value difference.

In the configuration described above, the optical output control circuit controls the optical output from the light-emitting element in proportion to the second integrated-value difference. With this, the amount of light that is emitted by the light-emitting element is adjusted according to the amount of light received by the light-receiving element. This makes it possible, even in the case of intense disturbance light, to ensure an S/N ratio sufficient for a sensing signal. Further, in the case of weak disturbance light, power consumption can be reduced by decreasing a driving current of the light-emitting element LED.

In the second aspect, the optical sensor is preferably configured to further include an emission cycle control circuit (emission cycle setting circuit 10) that controls an emission cycle so that an absolute value of the second integrated-value difference is at a minimum.

In the configuration described above, the emission cycle control circuit controls the emission cycle of the light-emitting element so that the absolute values of the second integrated-value differences are at a minimum. This makes it possible to approximate the absolute values of the second integrated-value differences to zero even in a case where disturbance light changes. This can facilitate the process of taking out only the reflected light component by eliminating the disturbance light component.

In an aspect of the present invention, an electronic device (smartphone 201) includes any one of the optical sensors described above.

The configuration described above makes it possible, even in an environment in which disturbance light is generated, accurately sense the position of an object to be sensed, without being affected by the disturbance light.

It should be noted that the present invention can also be expressed as follows:

An optical sensor that causes a light-emitting element to emit light and detects reflected light in synchronization with the emitted light outputs a difference between an integral output of a photocurrent from a light-receiving element during a time when the light-emitting element is emitting light (LED on) and an integral output of a photocurrent from the light-receiving element during a time when the light-emitting element is not emitting light (LED off) and a difference between an integral output of a photocurrent from the light-receiving element during a time when the light-emitting element is not emitting light (LED off) and an integral output of a photocurrent from the light-receiving element during a time when the light-emitting element is not emitting light (LED off).

With the configuration described above, for synchronization of a light-receiving circuit with an emission pulse and cancellation of disturbance light, a difference between the integrated value of a photocurrent of the light-receiving element during a time when LED is off and the integrated value of a photocurrent of the light-receiving element during a time when LED is off is detected, and in accordance with the detected value, the integrated value of light reflected from an object to be detected is compensated for or the emission intensity and the emission cycle are varied. This makes it possible to achieve a proximity sensor and a gesture sensor that are resistant to disturbance light.

The optical sensor updates the difference between the time when the light-emitting element is emitting light (LED on) and the time when the light-emitting element is not emitting light (LED off) when the absolute value of a difference in output between the time when the light-emitting element is not emitting light (LED off) and the time when the light-emitting element is not emitting light (LED off) is smaller than a set threshold value.

The optical sensor enters a non-sensing mode when the absolute value of the difference in output between the time when the light-emitting element is not emitting light (LED off) and the time when the light-emitting element is not emitting light (LED off) is larger than the set threshold value.

The optical sensor varies an optical output from the light-emitting element in proportion to the absolute value of the difference in output from an integrator between the time when the light-emitting element is not emitting light (LED off) and the time when the light-emitting element is not emitting light (LED off).

The optical sensor varies an emission cycle or an integration interval so that the absolute value of the difference in output between the time when the light-emitting element is not emitting light (LED off) and the time when the light-emitting element is not emitting light (LED off) is at a minimum.

Another optical sensor that causes a plurality of light-emitting elements to emit light and detects reflected light in synchronization with the emitted light includes a plurality of integrating circuits and outputs a difference between an integral output of a photocurrent from a light-receiving element during a time when the light-emitting elements are emitting light (LED on) and an integral output of a photocurrent from the light-receiving element during a time when the light-emitting elements are not emitting light (LED off) and a difference between an integral output of a photocurrent from the light-receiving element during a time when the light-emitting elements are not emitting light (LED off) and an integral output of a photocurrent from the light-receiving element during a time when the light-emitting elements are not emitting light (LED off).

The another optical sensor enters a non-sensing mode when a largest one of absolute values of differences in output from a plurality of integrators between the time when the light-emitting elements are not emitting light (LED off) and the time when the light-emitting elements are not emitting light (LED off) is larger than a set threshold value.

The another optical sensor varies an optical output from the light-emitting elements in proportion to the largest one of the absolute values of the differences in output from the plurality of integrators between the time when the light-emitting elements are not emitting light (LED off) and the time when the light-emitting elements are not emitting light (LED off).

The another optical sensor varies an emission cycle or an integration interval so that the largest one of the absolute values of the differences in output from the plurality of integrators between the time when the light-emitting elements are not emitting light (LED off) and the time when the light-emitting elements are not emitting light (LED off) is at a minimum.

A mobile phone includes any of the optical sensors and the another optical sensor.

The present invention is not limited to the description of the embodiments above, but may be altered by a skilled person within the scope of the claims. An embodiment based on a proper combination of technical means disclosed in different embodiments is encompassed in the technical scope of the present invention. Furthermore, the technical means disclosed in different embodiments can be combined to form a new technical feature.

INDUSTRIAL APPLICABILITY

The present invention is suitably applicable to a proximity sensor or a gesture sensor using a reflective optical sensor.

REFERENCE SIGNS LIST

1 Integrating Circuit
1A Integrating circuit
1a Integrator
1b Integrator
1Ab Integrator
2 AD converter
3 Output control circuit
3A Output control circuit
3a Register
3b First comparator
3c Second comparator
3d Register control circuit
3e Subtracting circuit
5 Integrating control signal generating circuit
7 Driving signal generating circuit
8 Driving circuit
9 Driving current setting circuit
10 Emission cycle setting circuit
11 to 14 Integrating circuit
21 to 24 AD converter
90 Light receiving and emitting unit
90A Light receiving and emitting unit
100 Object to be sensed
101 Optical sensor
102 Optical sensor
103 Optical sensor
104 Optical sensor
105 Optical sensor
106 Optical sensor
151 Comparison circuit
201 Smartphone (electronic device)
LED Light-emitting element
INT1 Integral period
INT2 Integral period
INT3 Integral period
INT4 Integral period
PD Light-receiving element
PD1 Light-receiving element
PD2 Light-receiving element
PD3 Light-receiving element
PD4 Light-receiving element
DPD Light-receiving element
T1 First period
T2 Second period
T3 Third period
T4 Fourth period

The invention claimed is:

1. An optical sensor comprising:
a light-emitting element;
a light-receiving element that generates a photocurrent upon receiving reflected light from an object to be sensed reflecting light emitted by the light-emitting element;
a driving circuit that causes the light-emitting element to be on or off during a first period, a second period, and a fourth period among four periods provided consecutively and that causes the light-emitting element to be off or on during a third period among the four periods, the first period and the second period constituting a disturbance light sensing period during which disturbance light is sensed, and the third period and the fourth period constituting a disturbance light/object-to-be-sensed sensing period during which the disturbance light and the object to be sensed are sensed;
an integrating circuit that outputs a first integrated-value difference and a second integrated-value difference, the first integrated-value difference being a difference between an integrated value of the photocurrent generated in accordance with a state of the light-emitting element during the first period and an integrated value of the photocurrent generated in accordance with a state of the light-emitting element during the second period, the second integrated-value difference being a difference between an integrated value of the photocurrent generated in accordance with a state of the light-emitting element during the third period and an integrated value of the photocurrent generated in accordance with a state of the light-emitting element during the fourth period; and
an output control circuit that outputs the second integrated-value difference when the first integrated-value difference is zero and that outputs a difference between the second integrated-value difference and the first integrated-value difference when the first integrated-value difference is not zero.

2. The optical sensor as set forth in claim 1, wherein the output control circuit updates the second integrated-value difference when an absolute value of the first integrated-value difference is smaller than a threshold value set in advance and does not update the second integrated-value difference when the absolute value of the first integrated-value difference is not smaller than the threshold value.

3. The optical sensor as set forth in claim 1, further comprising an optical output control circuit that controls an optical output from the light-emitting element in proportion to the first integrated-value difference.

4. The optical sensor as set forth in claim 1, further comprising an emission cycle control circuit that controls an emission cycle so that an absolute value of the first integrated-value difference is at a minimum.

5. An electronic device comprising an optical sensor as set forth in claim 1.

6. An optical sensor comprising:
a light-emitting element;
a light-receiving element that generates a photocurrent upon receiving reflected light from an object to be sensed reflecting light emitted by the light-emitting element;
a driving circuit that causes the light-emitting element to be on or off during a first period among four periods provided consecutively and that causes the light-emitting element to be off or on during a second period, a third period, and a fourth period among the four periods, the first period and the second period constituting a disturbance light/object-to-be-sensed sensing period during which disturbance light and the object to be sensed are sensed, and the third period and the fourth period constituting a disturbance light sensing period during which the disturbance light is sensed;
an integrating circuit that outputs a first integrated-value difference and a second integrated-value difference, the first integrated-value difference being a difference between an integrated value of the photocurrent generated in accordance with a state of the light-emitting element during the first period and an integrated value of the photocurrent generated in accordance with a state of the light-emitting element during the second period, the second integrated-value difference being a difference between an integrated value of the photocurrent generated in accordance with a state of the light-emitting element during the third period and an integrated value of the photocurrent generated in accordance with a state of the light-emitting element during the fourth period; and an output control circuit that outputs the first integrated-value difference when the second integrated-value difference is zero and that outputs a difference between the first integrated-value difference and the second integrated-value difference when the second integrated-value difference is not zero.

7. The optical sensor as set forth in claim 6, wherein the output control circuit outputs the first integrated-value difference when an absolute value of the second integrated-value difference is smaller than a threshold value set in advance and does not output the first integrated-value difference when the absolute value of the second integrated-value difference is not smaller than the threshold value.

8. The optical sensor as set forth in claim 6, further comprising an optical output control circuit that controls an optical output from the light-emitting element in proportion to the second integrated-value difference.

9. The optical sensor as set forth in claim 6, further comprising an emission cycle control circuit that controls an emission cycle so that an absolute value of the second integrated-value difference is at a minimum.

* * * * *